(12) United States Patent
Aikawa et al.

(10) Patent No.: US 8,392,493 B2
(45) Date of Patent: *Mar. 5, 2013

(54) NOISE CANCELING DEVICE, WEIGHING DEVICE, METHOD OF CANCELING A NOISE, AND METHOD OF DESIGNING A DIGITAL FILTER

(75) Inventors: Naoyuki Aikawa, Tokyo (JP); Yukio Morishita, Shiga (JP)

(73) Assignee: Ishida Co., Ltd., Tokyo (JP)

( * ) Notice: Subject to any disclaimer, the term of this patent is extended or adjusted under 35 U.S.C. 154(b) by 1142 days.

This patent is subject to a terminal disclaimer.

(21) Appl. No.: 12/301,380

(22) PCT Filed: Jan. 18, 2008

(86) PCT No.: PCT/JP2008/050625
§ 371 (c)(1),
(2), (4) Date: Nov. 18, 2008

(87) PCT Pub. No.: WO2008/090822
PCT Pub. Date: Jul. 31, 2008

(65) Prior Publication Data
US 2009/0125575 A1   May 14, 2009

(30) Foreign Application Priority Data
Jan. 23, 2007  (JP) .................................. 2007-012976

(51) Int. Cl.
*G06F 17/10* (2006.01)
(52) U.S. Cl. ........................................ 708/319; 708/323
(58) Field of Classification Search ........... 708/300–323
See application file for complete search history.

(56) References Cited

U.S. PATENT DOCUMENTS 7,028,061 B2 * 4/2006 Mogi et al. ..................... 708/319
7,222,144 B2 * 5/2007 Aikawa et al. ................ 708/319

FOREIGN PATENT DOCUMENTS

JP       2004-314515       11/2004

OTHER PUBLICATIONS

Patent Abstracts of Japan, Publication No. 2004-314515, published Nov. 11, 2004.
Satoshi Takahashi et al., "FIR filter with variable stopbands using Farrow structure", IEICE Technical Report, The Institute of Electronics, Information and Communication Engineers, vol. 106, No. 116, Jun. 16, 2006, pp. 49-54.
Satoshi Takahashi et al., "A design method of Variable filters changing multi factors", IEICE Technical Report, The Institute of Electronics, Information and Communication Engineers, vol. 106, No. 477, Jan. 19, 2007, pp. 37-40.
Japanese Office Action mailed May 29, 2012 issued in corresponding Japanese Patent Application No. 2007-012976.

* cited by examiner

*Primary Examiner* — Tan V. Mai
(74) *Attorney, Agent, or Firm* — Staas & Halsey LLP

(57) ABSTRACT

It is an object of the present invention to provide techniques which allow for easier change in filter characteristics of a digital filter. Then, in order to attain this object, in a weighing device according to the present invention, a filter coefficient calculator (6) calculates a filter coefficient using a predetermined mathematical expression and outputs the result to a signal processor (5). The signal processor (5) carries out a filtering process on a weight signal (DS) of a digital signal using the filter coefficient. The mathematical expression includes a first parameter which specifies an amount of attenuation in at least one attenuation band where attenuation should be locally intensified in a stopband of amplitude characteristics of the filtering process, a second parameter which specifies the band position of the at least one attenuation band, and a third parameter which specifies a starting frequency of the stopband.

18 Claims, 27 Drawing Sheets

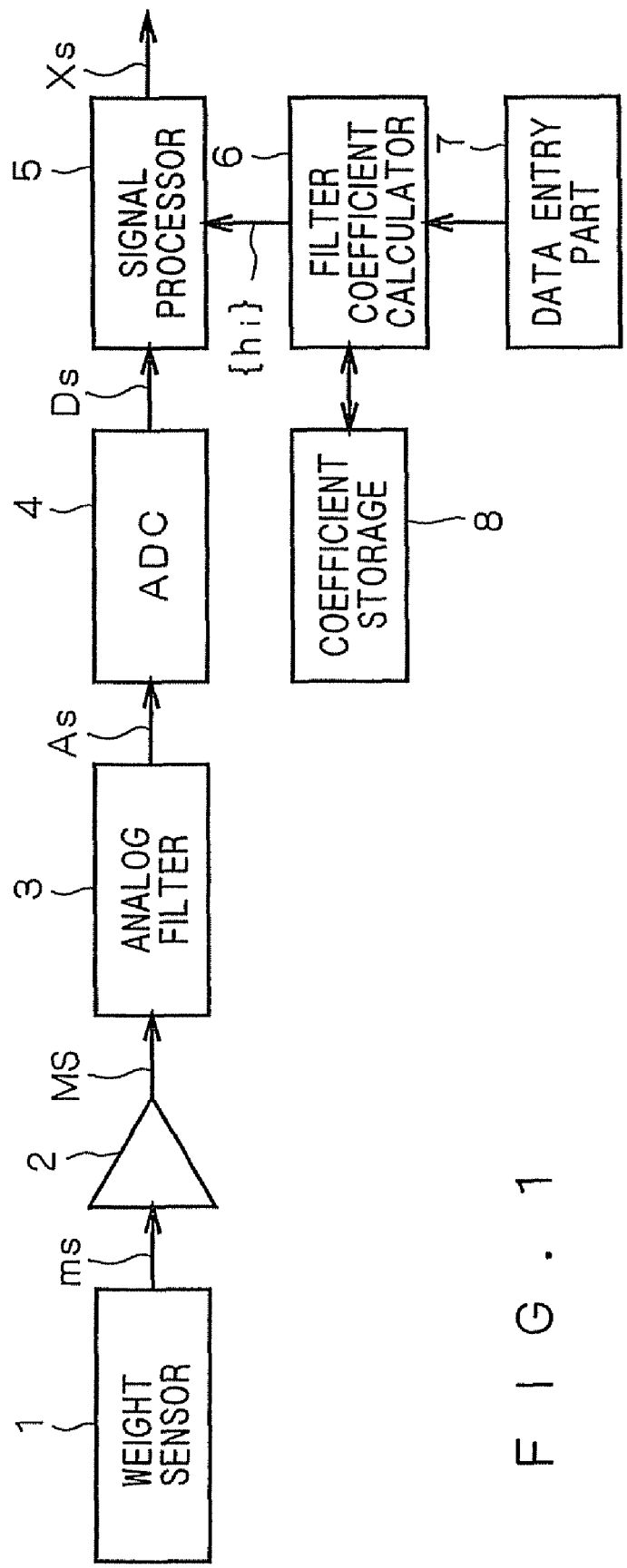
F I G . 1

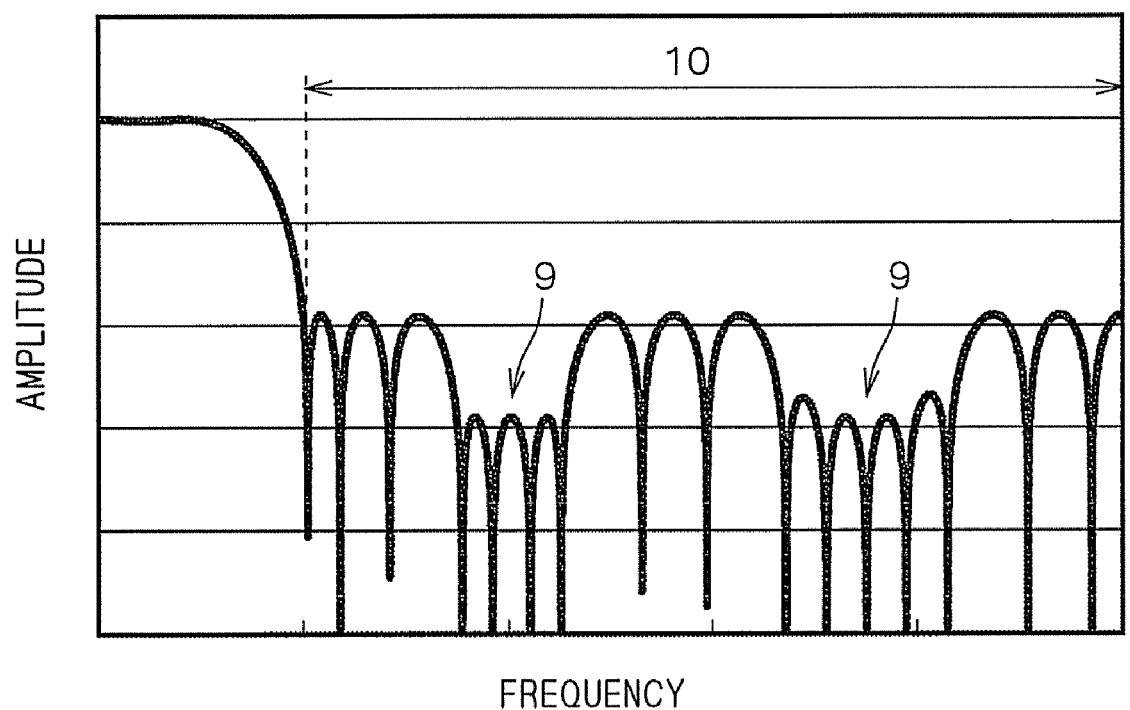

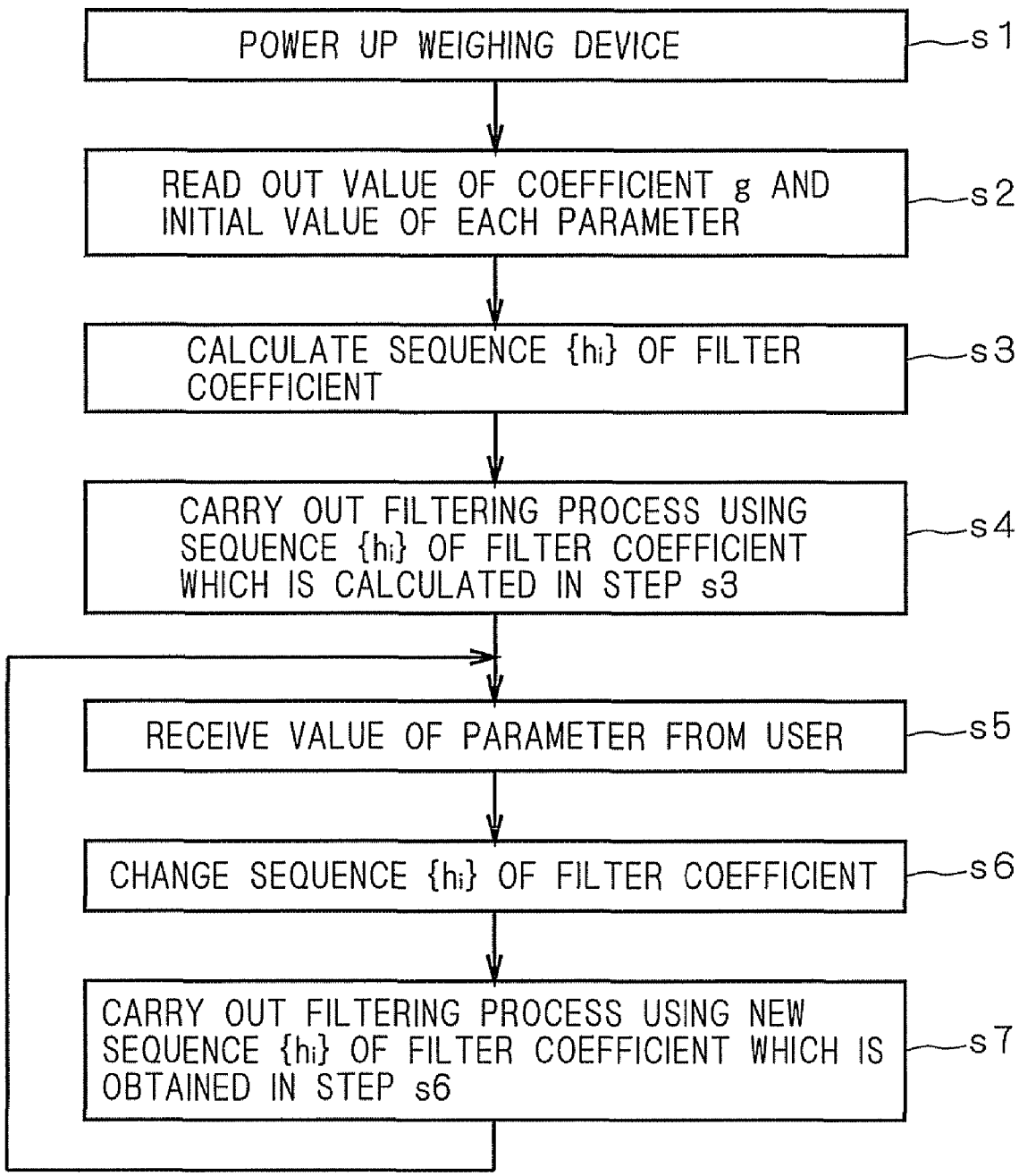

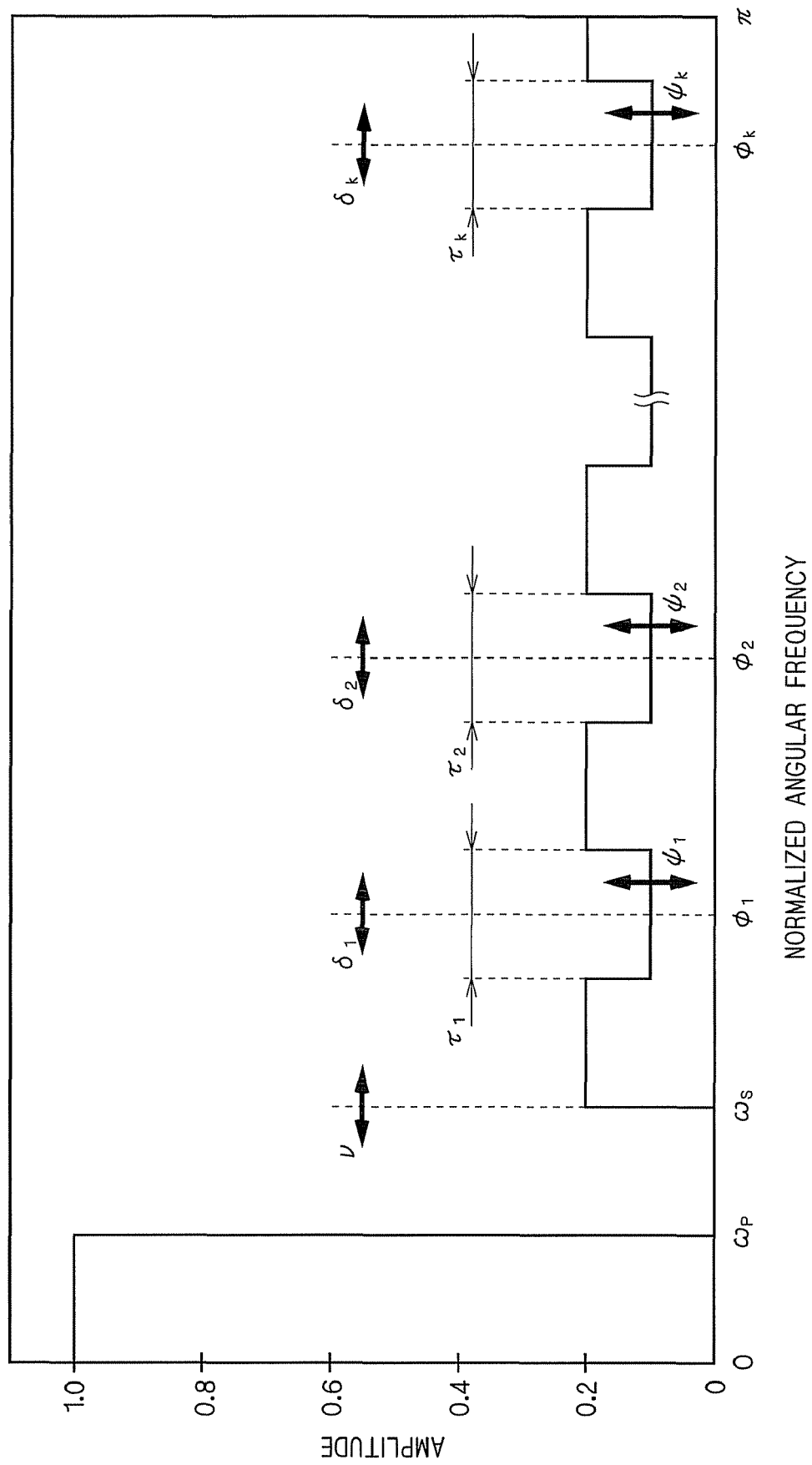

$\nu = -0.02\pi \quad \psi_1 = 1$ $\nu = -0.02\pi \quad \psi_1 = 10$

F I G. 1 5
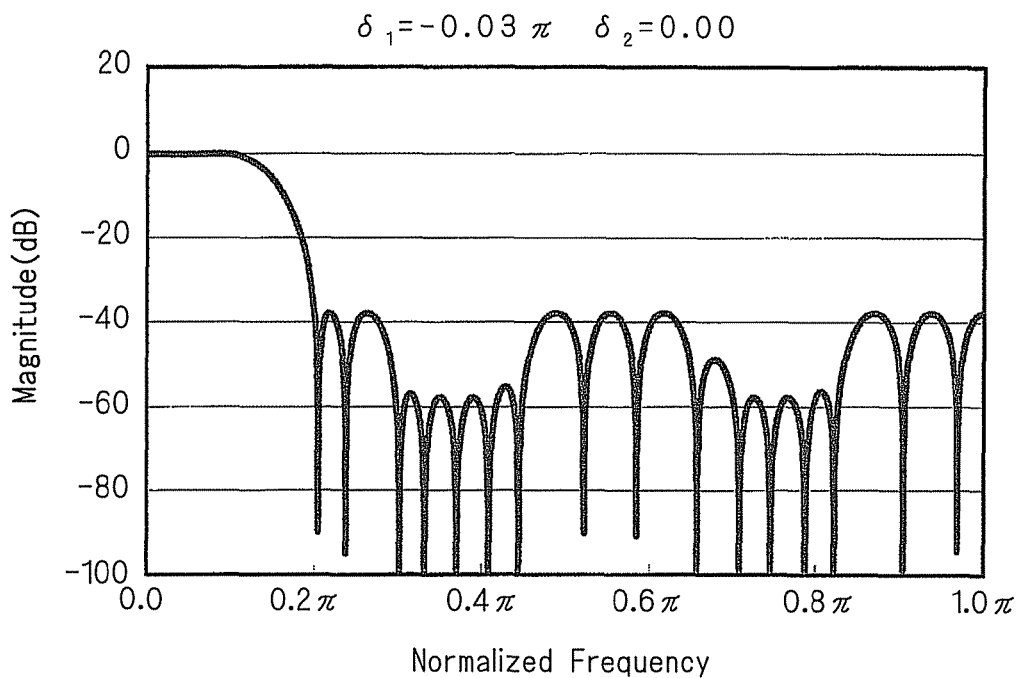
F I G. 1 6
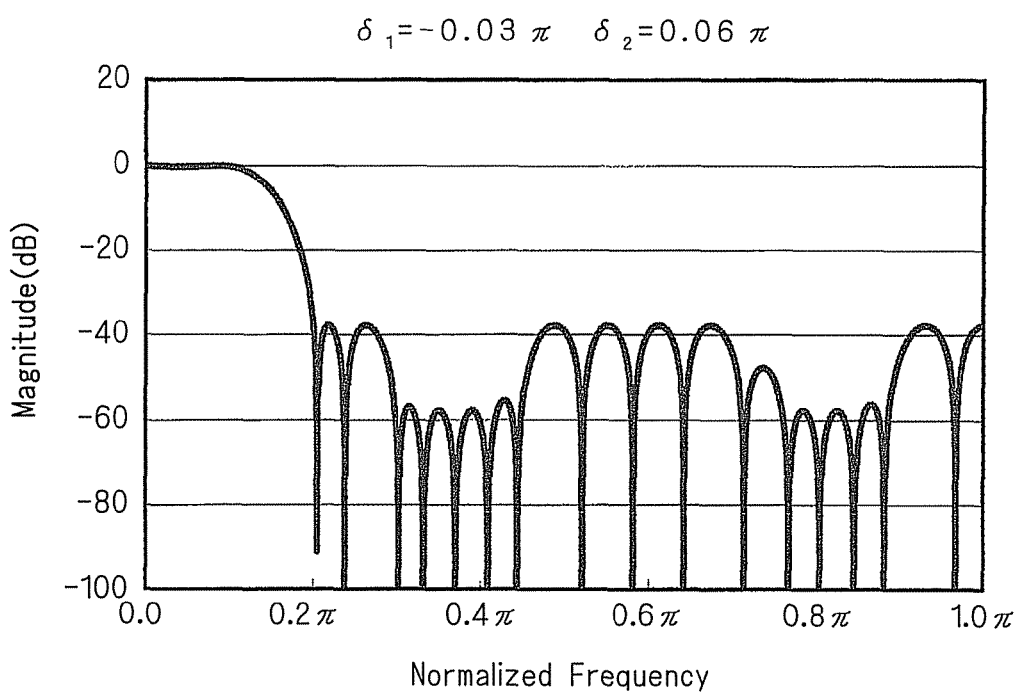

F I G. 1 9
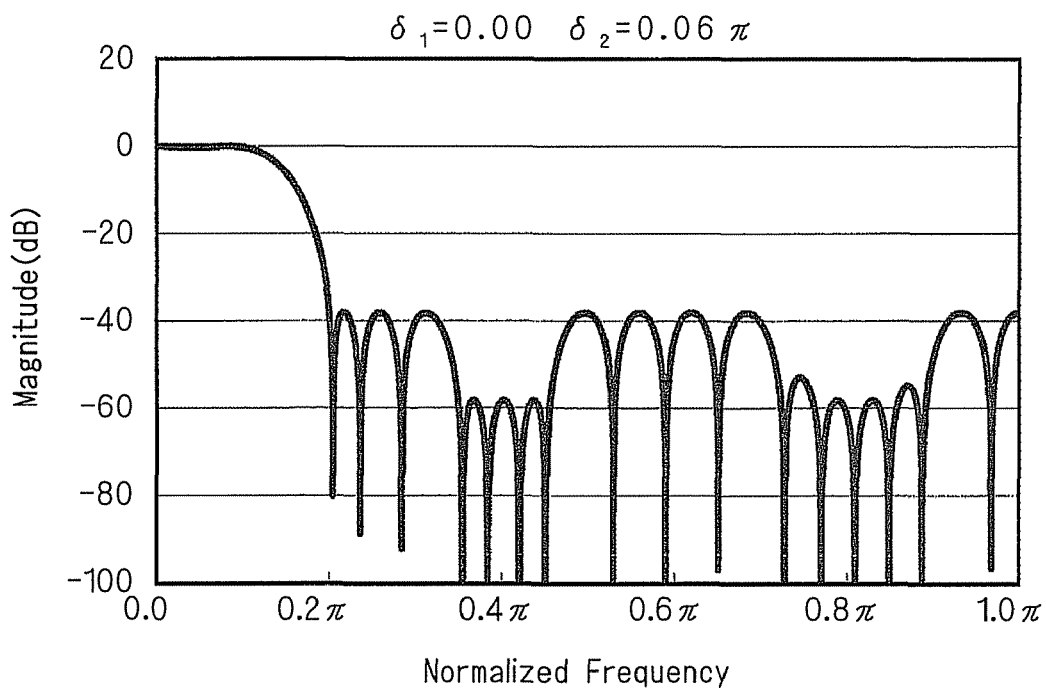
F I G. 2 0
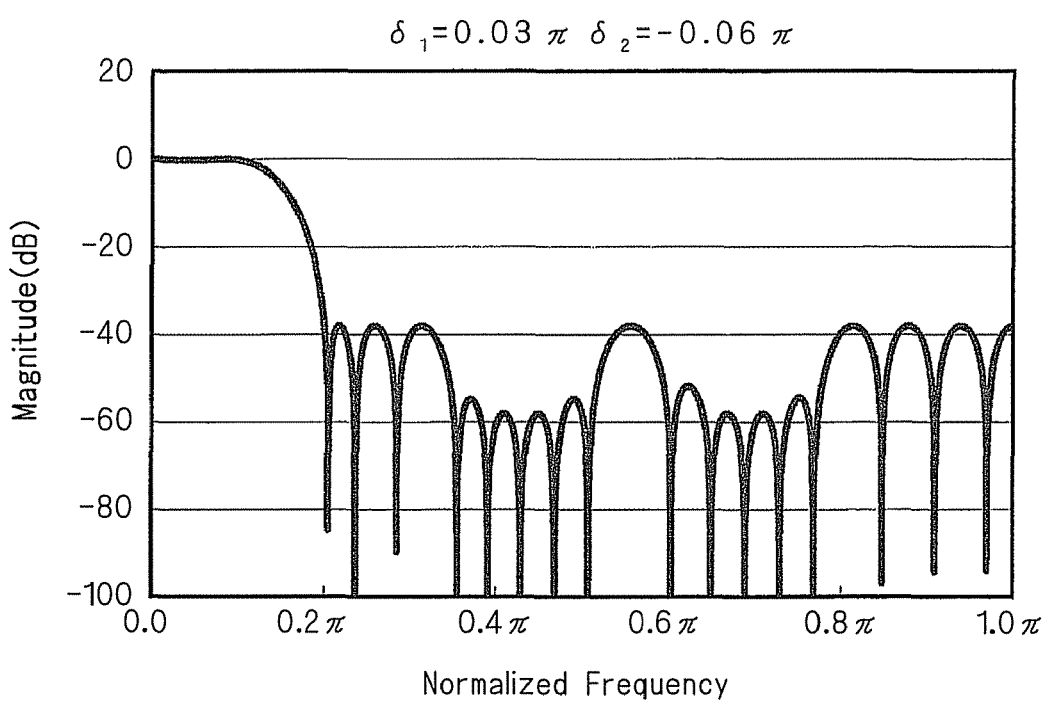

F I G . 2 1
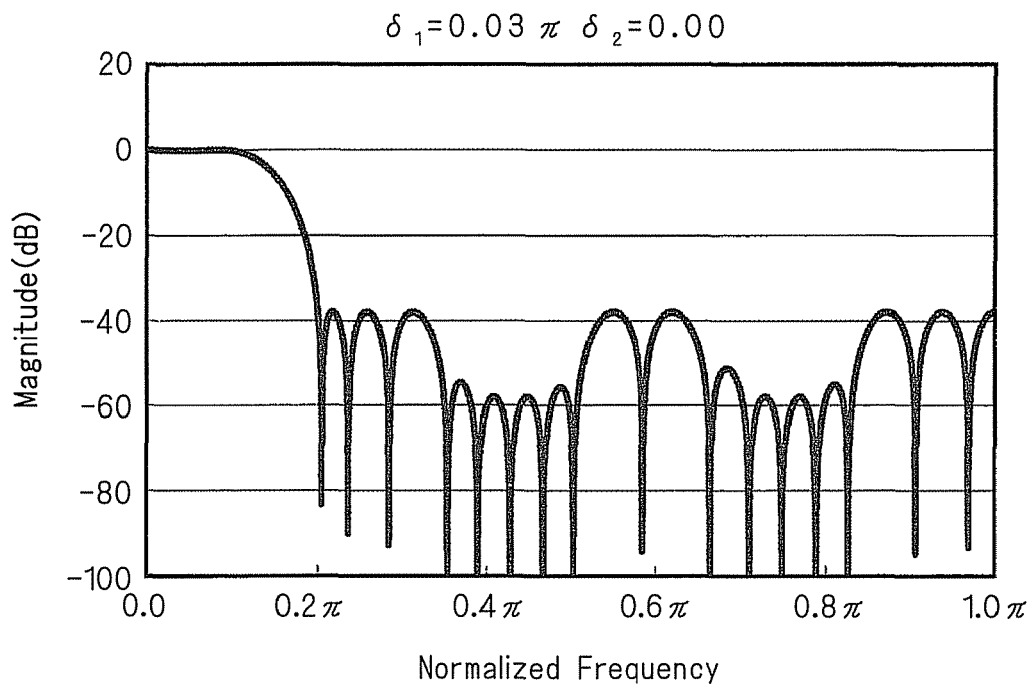
F I G . 2 2
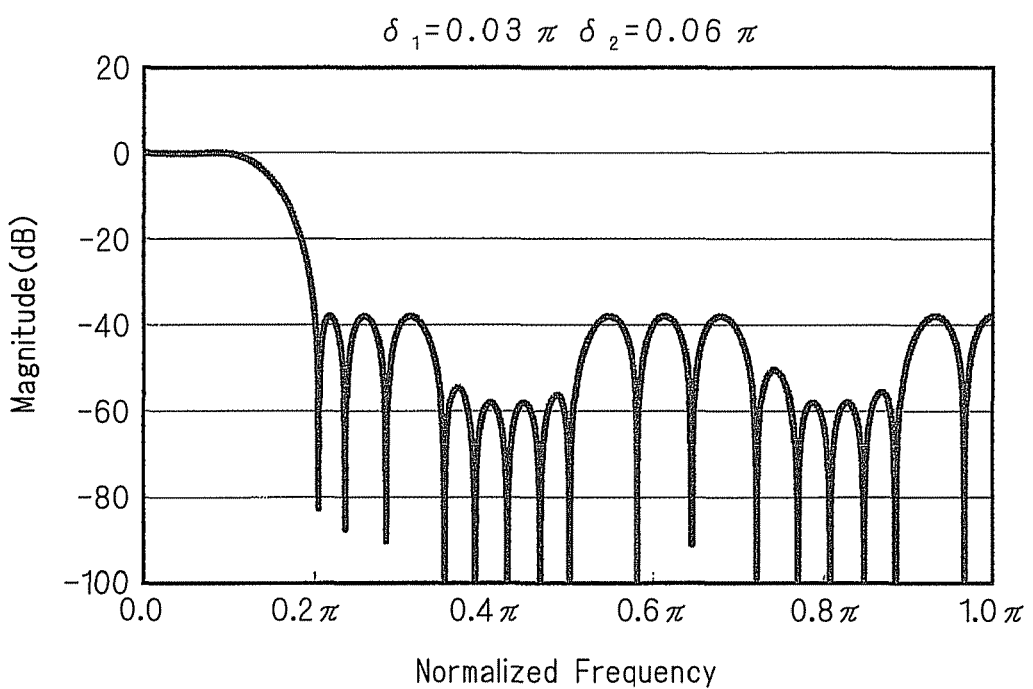

F I G . 2 3
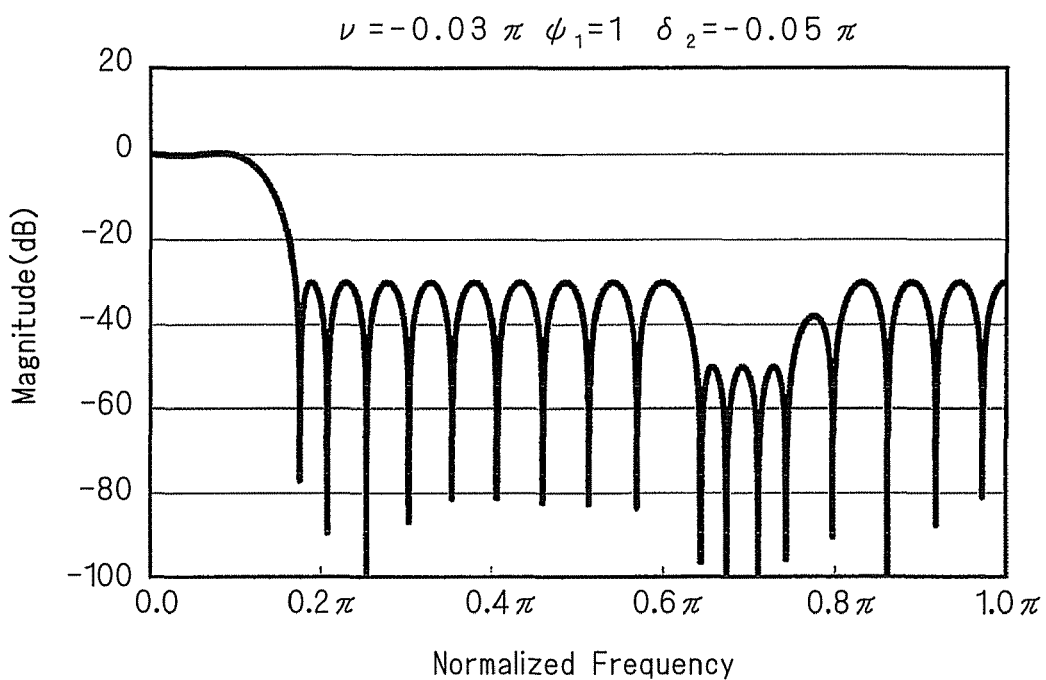
F I G . 2 4
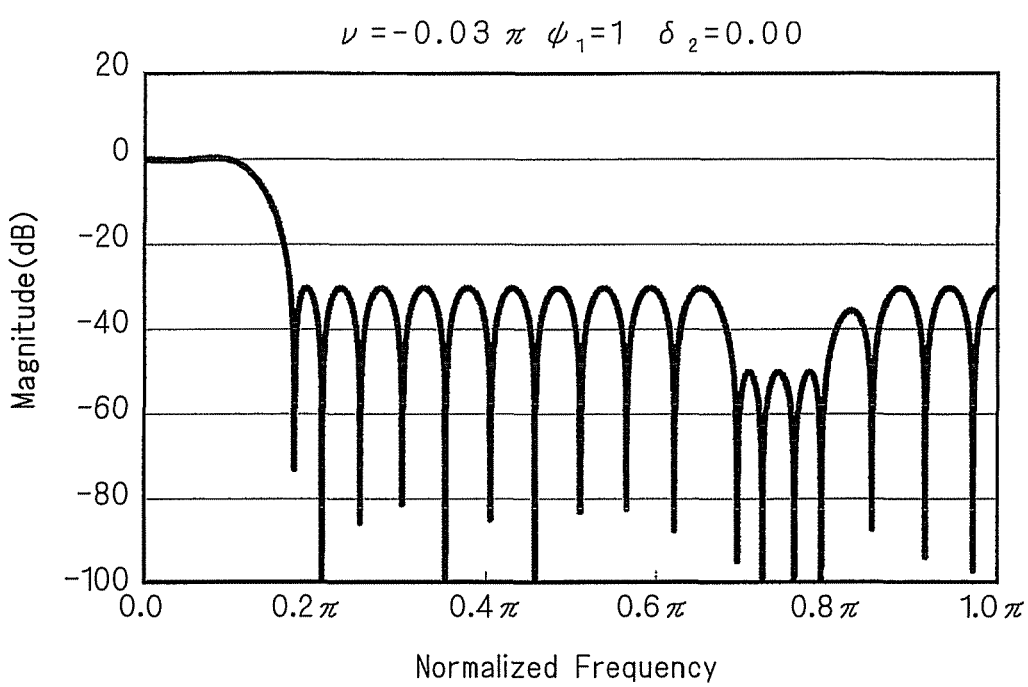

F I G . 2 5
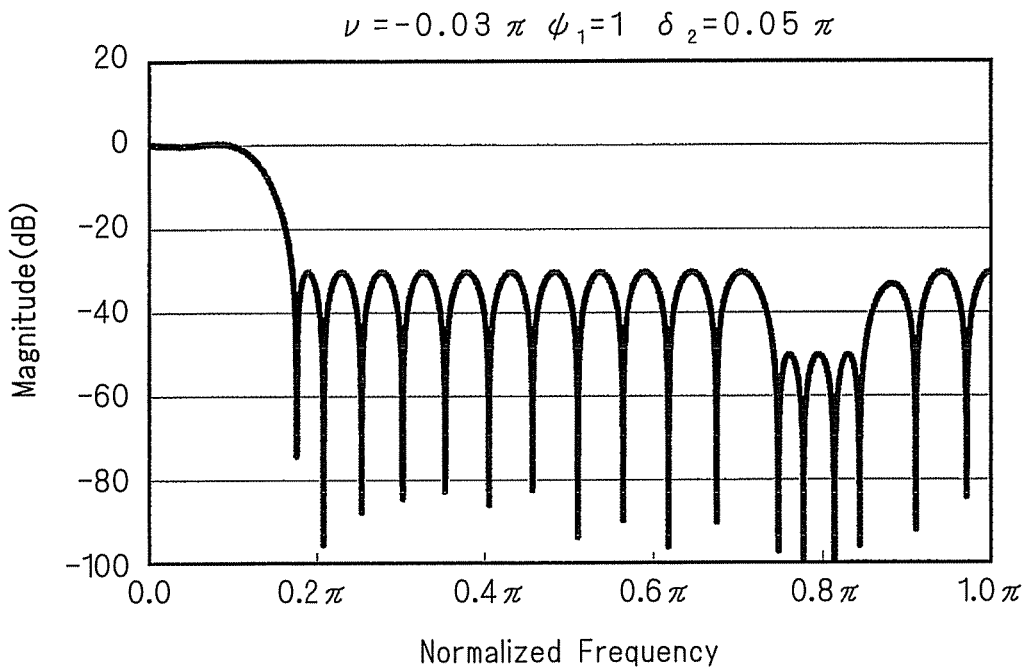
F I G . 2 6
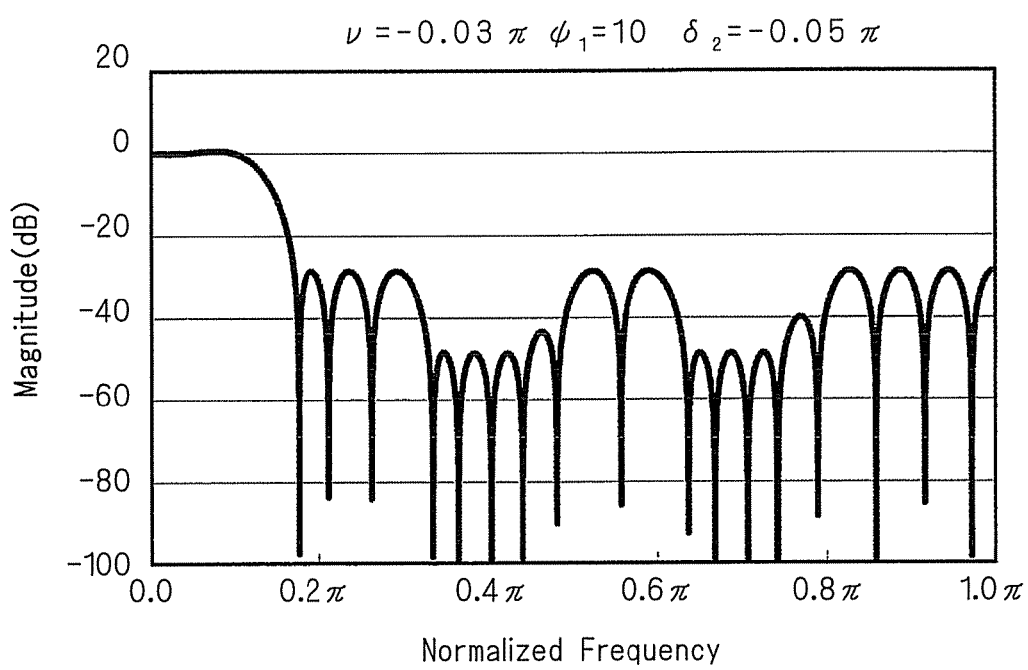

F I G . 2 7
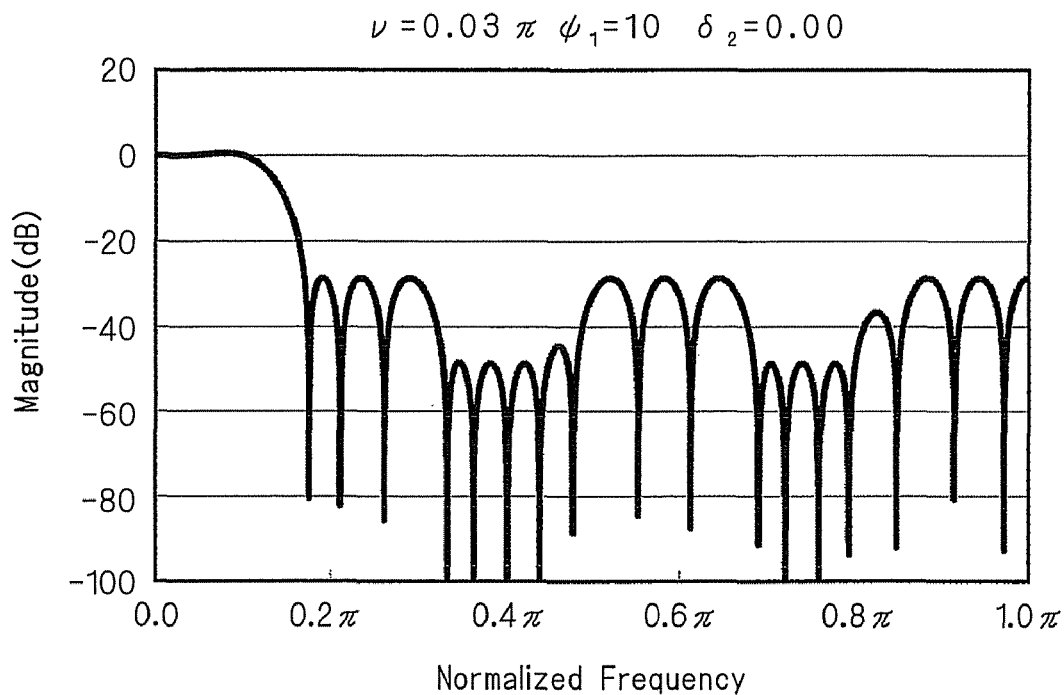
$\nu = 0.03\pi \quad \psi_1 = 10 \quad \delta_2 = 0.00$
F I G . 2 8
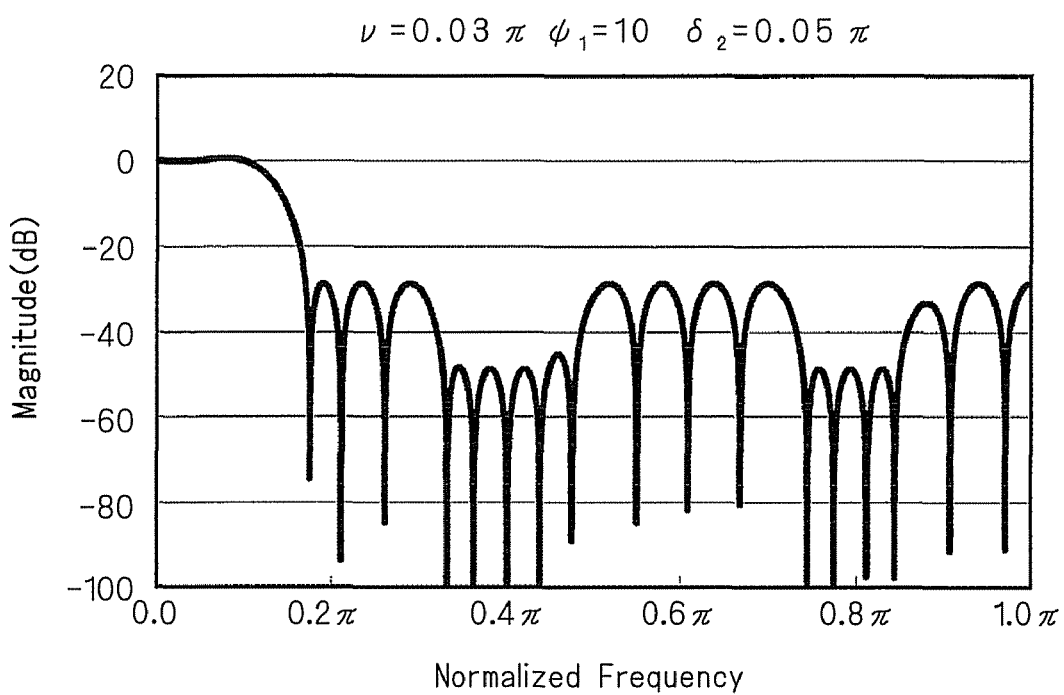
$\nu = 0.03\pi \quad \psi_1 = 10 \quad \delta_2 = 0.05\pi$ F I G . 3 1
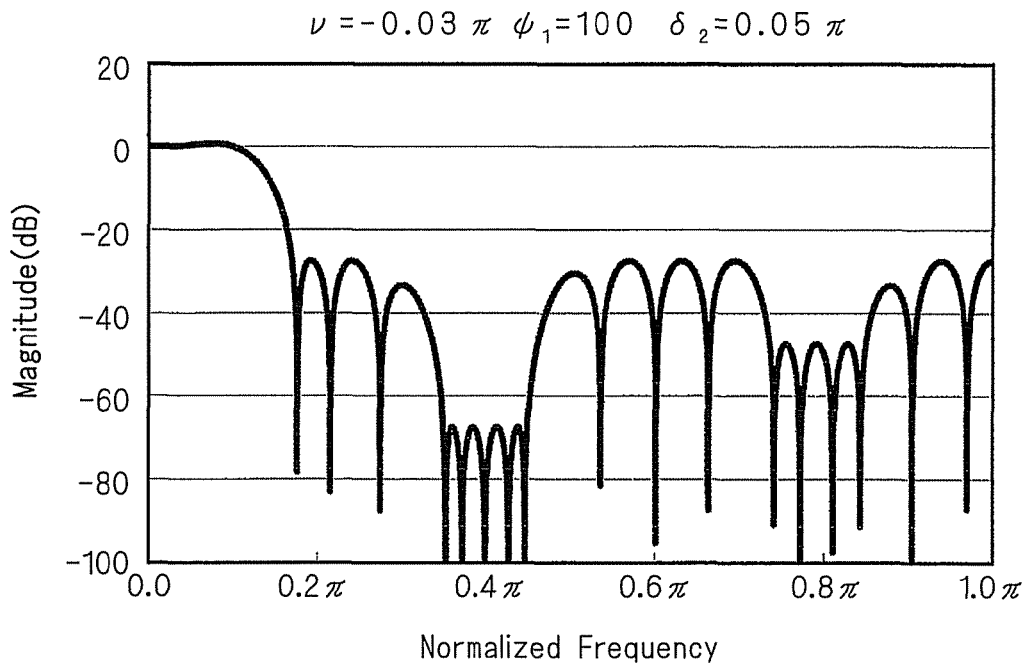
F I G . 3 2
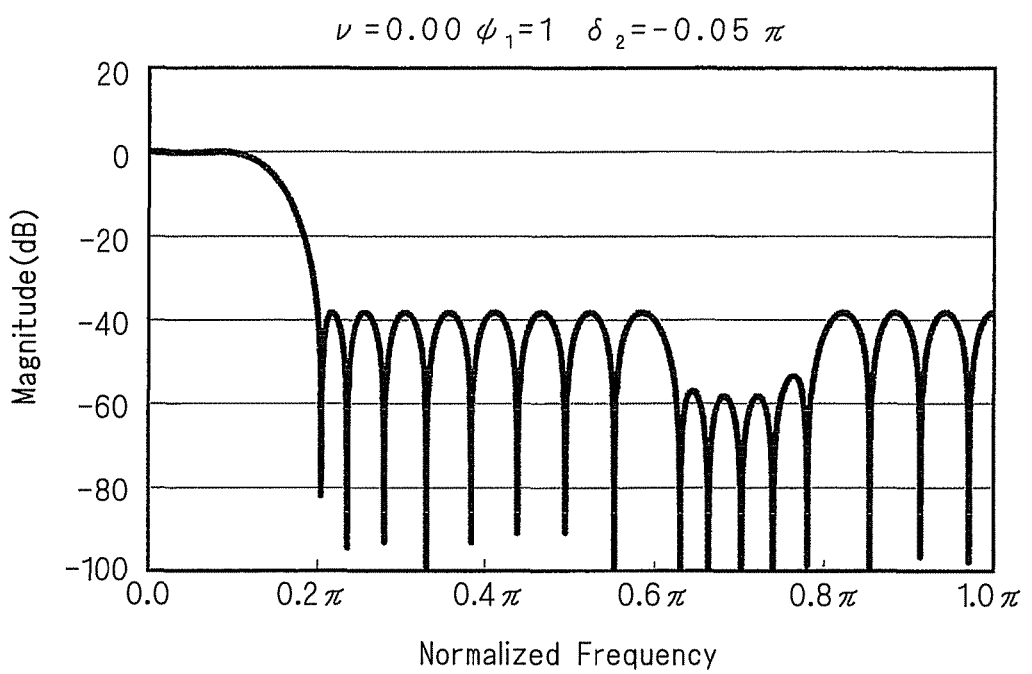

F I G . 3 3
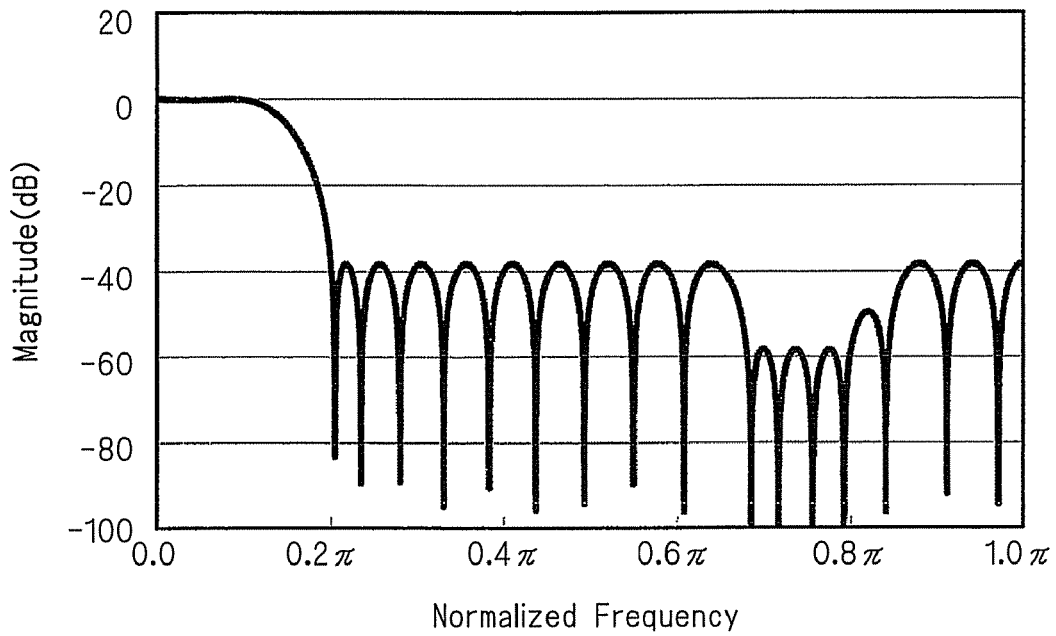
F I G . 3 4
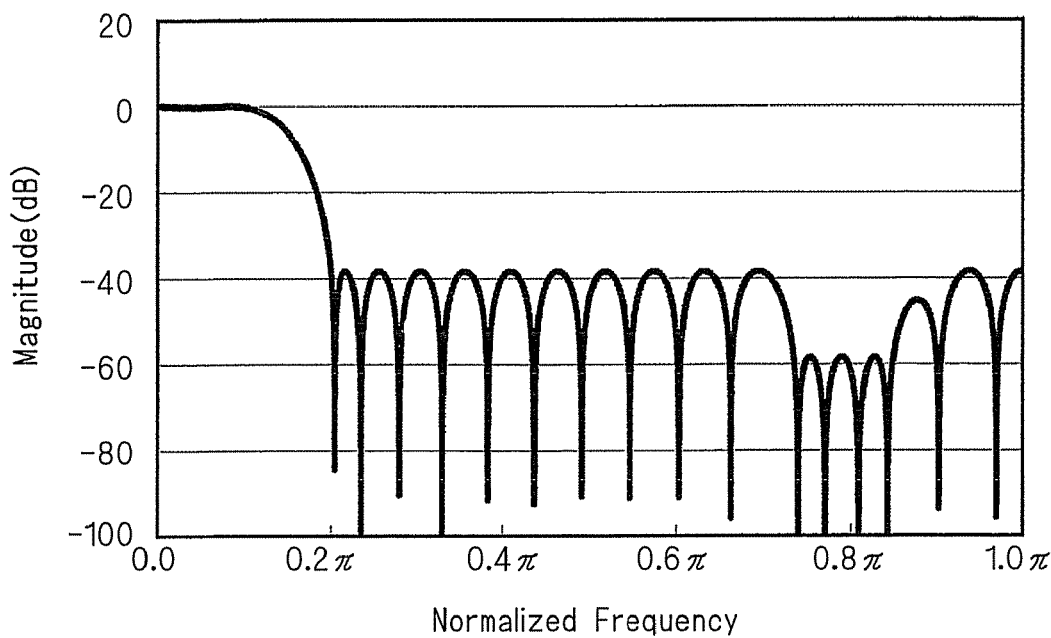

F I G . 3 5
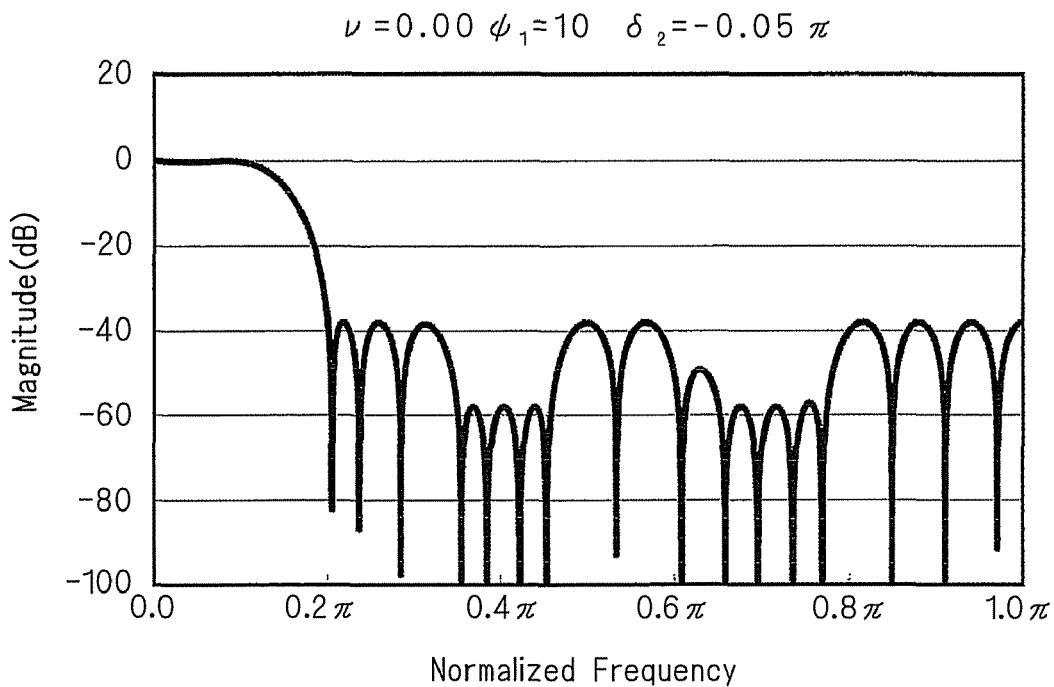
F I G . 3 6
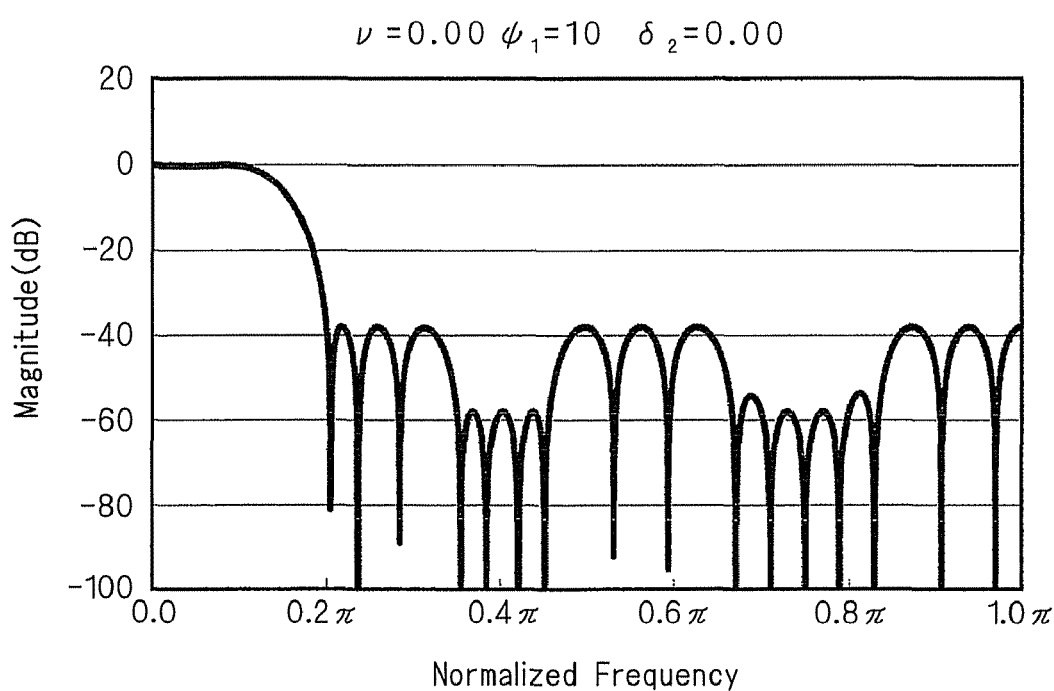

F I G . 3 9
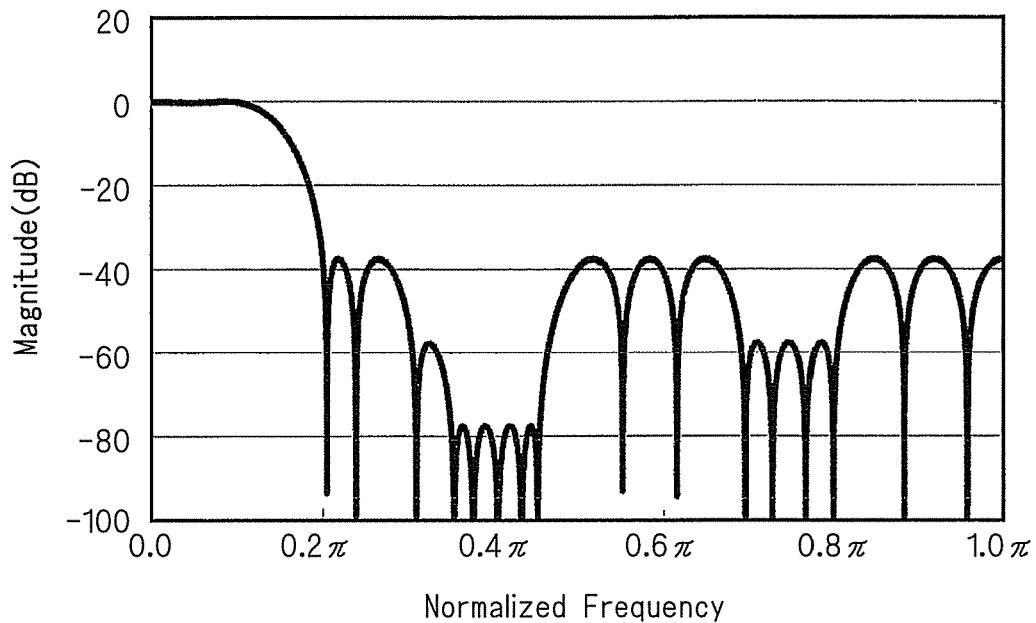
F I G . 4 0
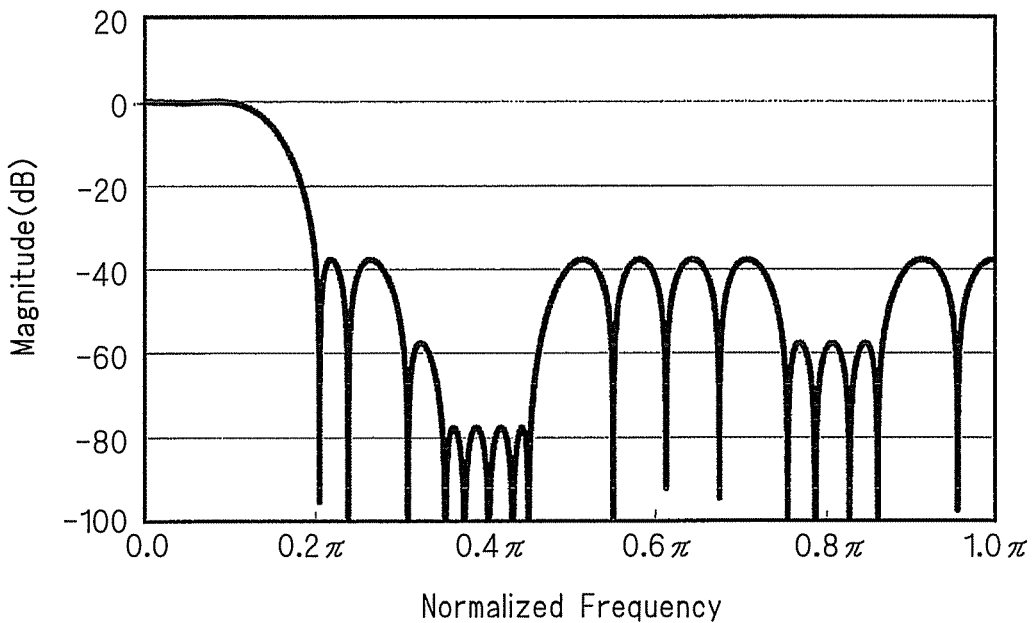

F I G . 4 1
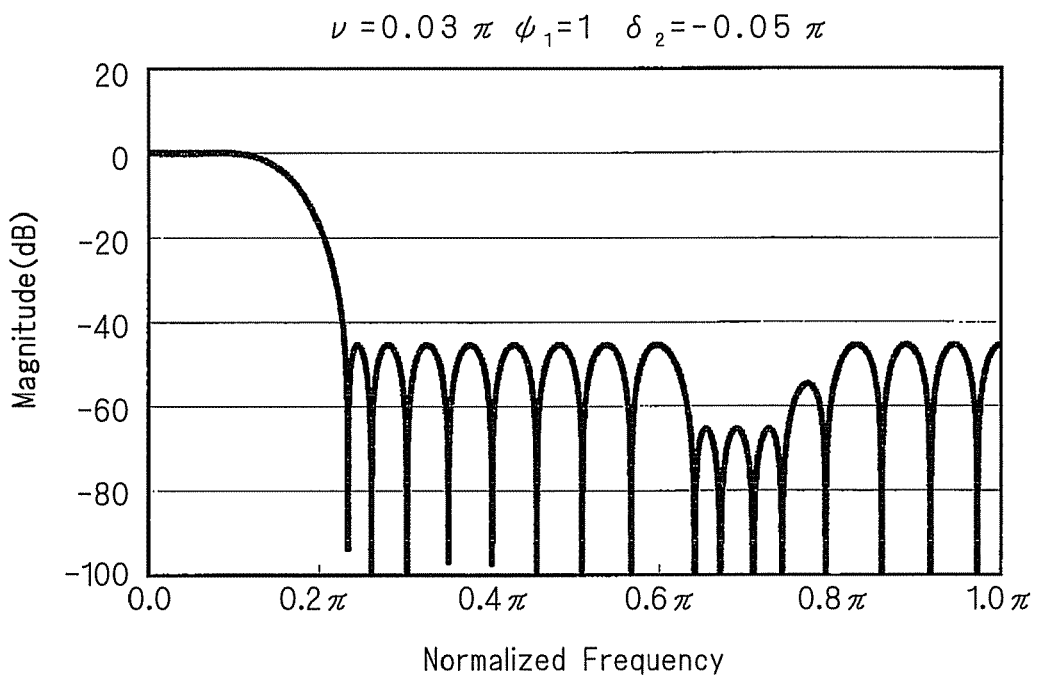
F I G . 4 2
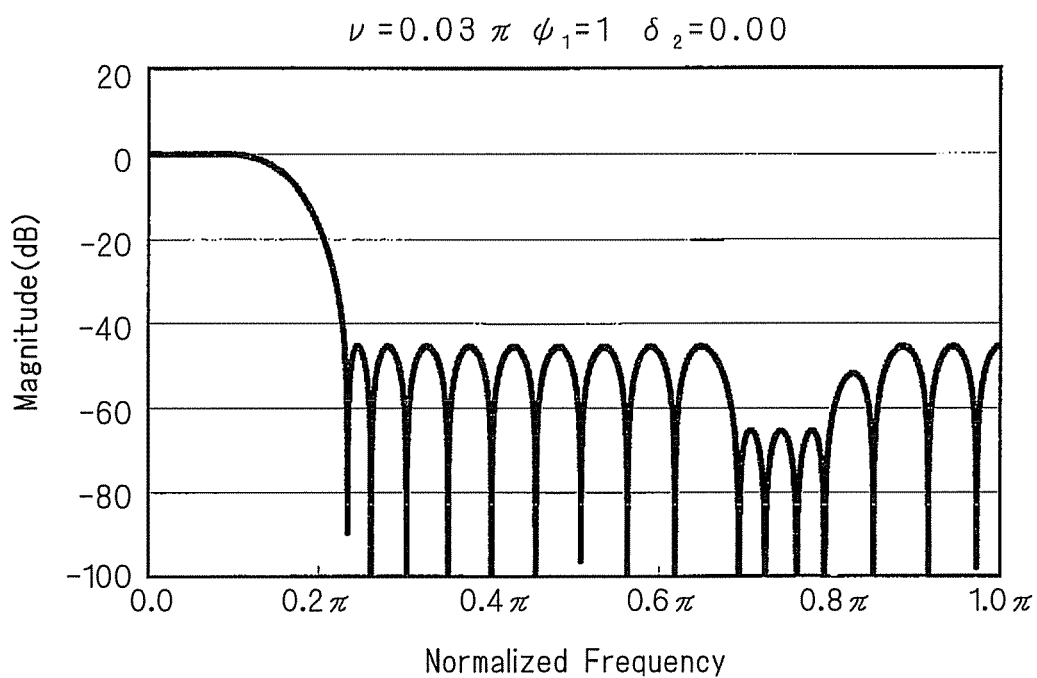

F I G. 4 3
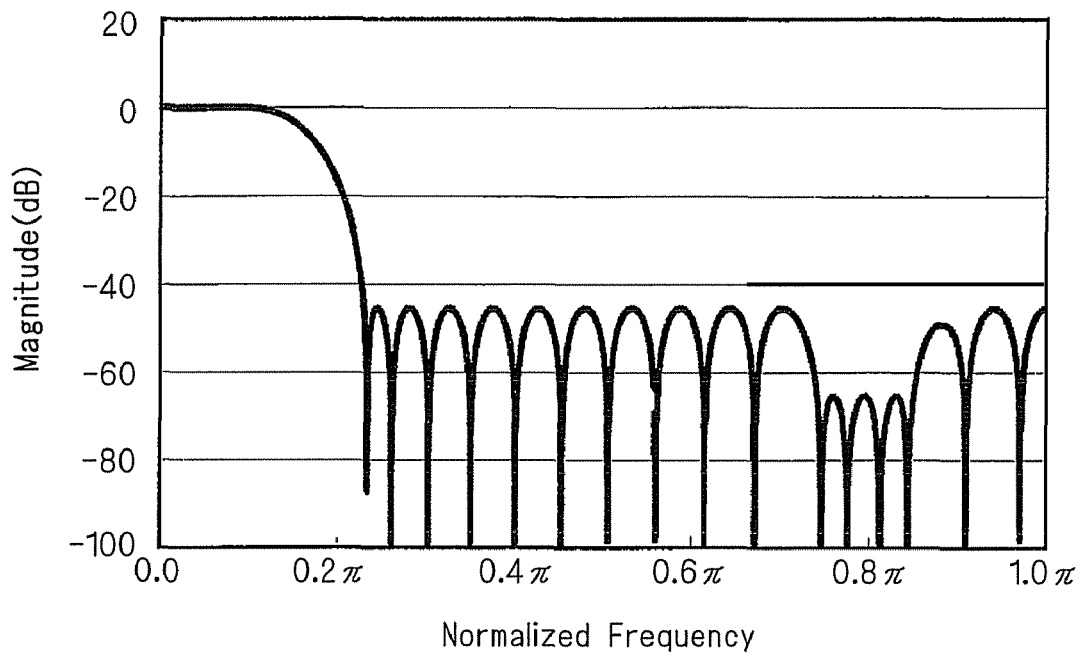
F I G. 4 4
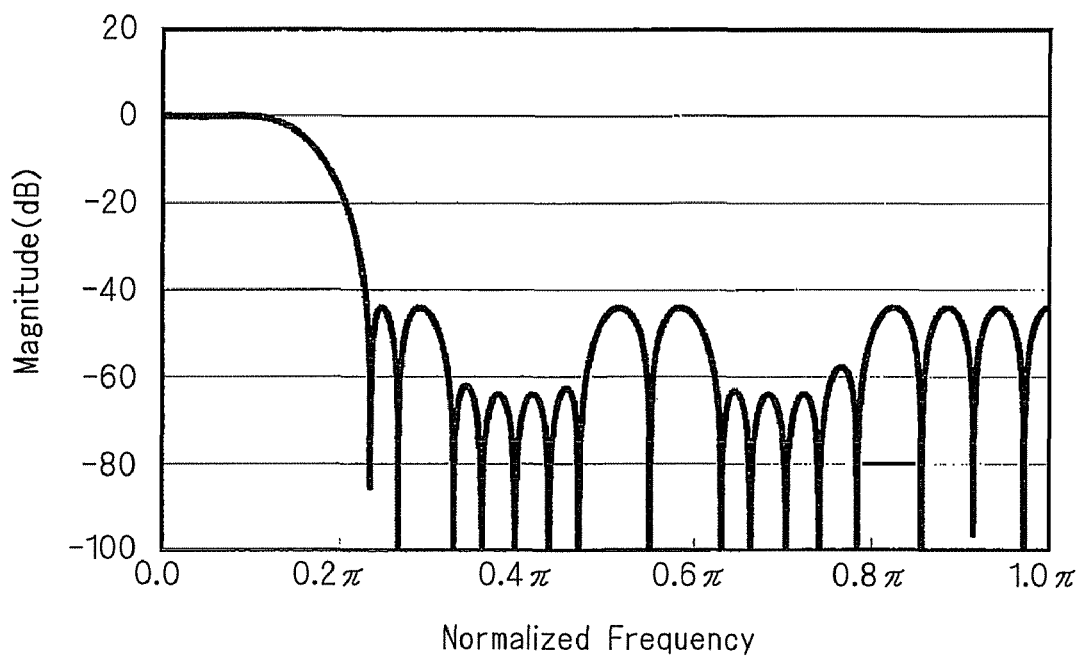

F I G . 4 5
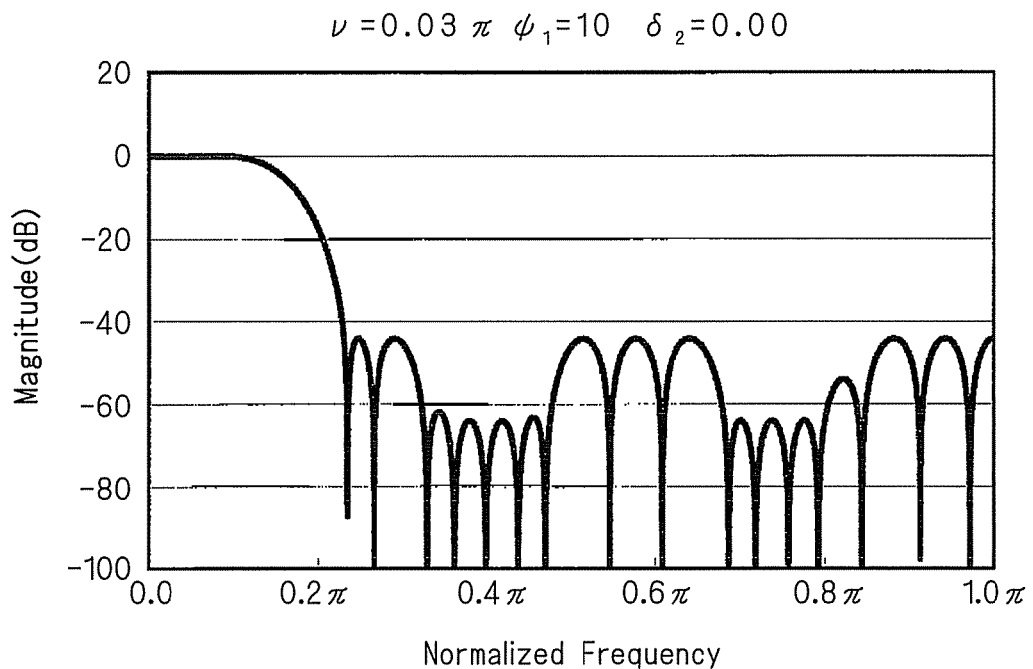
F I G . 4 6
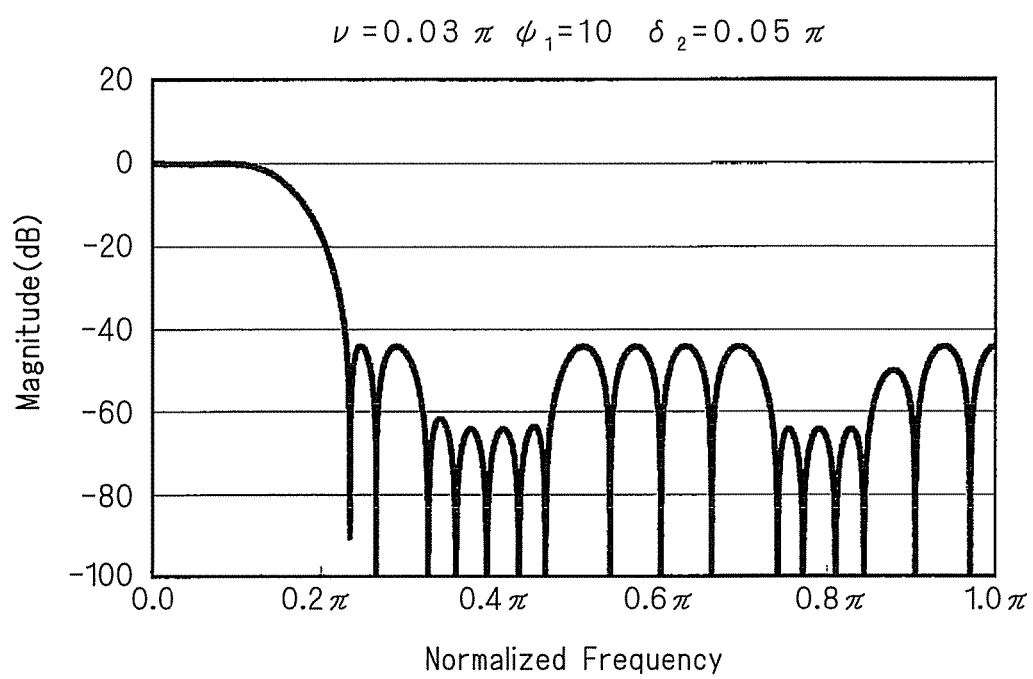

F I G . 4 7
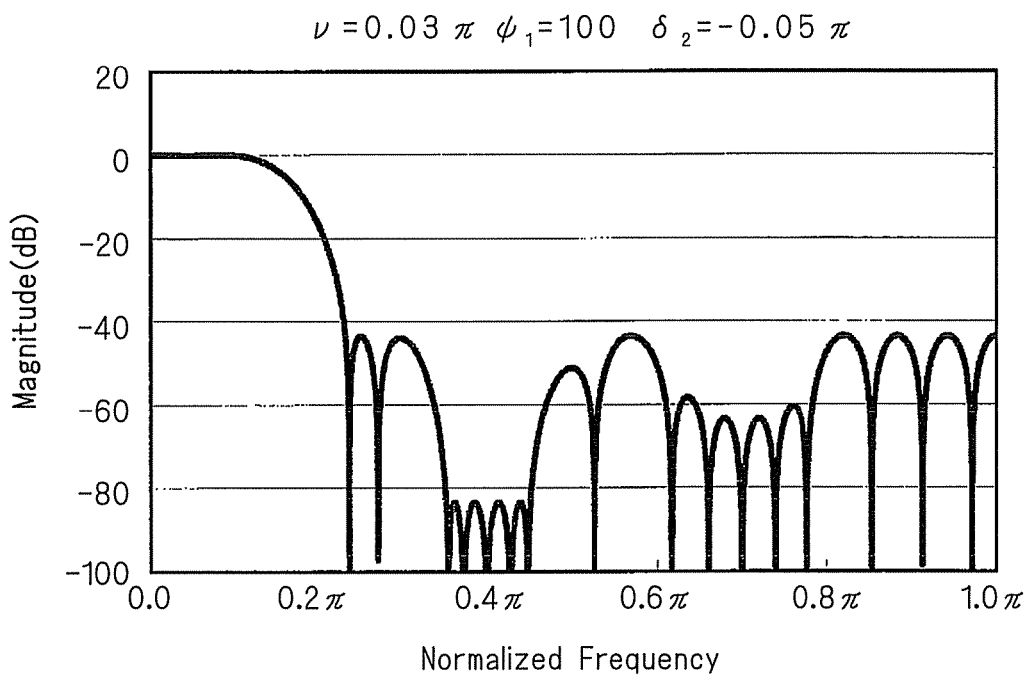
F I G . 4 8
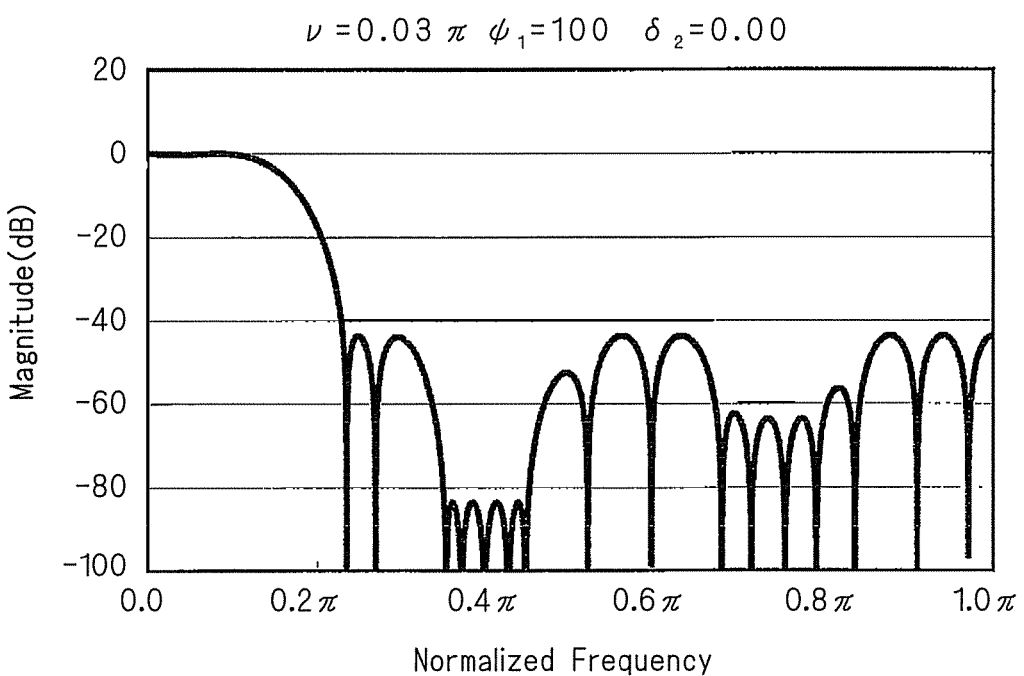

NOISE CANCELING DEVICE, WEIGHING DEVICE, METHOD OF CANCELING A NOISE, AND METHOD OF DESIGNING A DIGITAL FILTER

CROSS REFERENCE TO RELATED APPLICATIONS

This application claims the benefit under 35 U.S.C. Section 371, of International Application No. PCT/JP2008/050625, filed Jan. 18, 2008, which claimed priority to Japanese Application No. 2007-012976, filed Jan. 23, 2007 in the Japanese Patent Office, the disclosures of all of which are hereby incorporated by reference.

TECHNICAL FIELD

The present invention relates to filtering techniques with a digital filter.

BACKGROUND ART

For a weighing device for measuring a weight of an article, a weight sensor such as a load cell of strain gauge type and a force balance is employed. Such a weight sensor as cited has a natural frequency which is subject to a gross weight including a weight of an article itself and a tare. When external vibration at frequencies in a band including a natural frequency acts upon a measuring system, vibration at a frequency close to the natural frequency in the external vibration is amplified, to work as a vibration noise, which is then introduced in a measuring signal output from a weight sensor. Such a vibration noise as noted above will be hereinafter referred to as a "natural frequency noise".

Also, in measuring a load of a transfer system, a noise caused due to vibration of a rotation system such as a motor for driving a conveyor belt and a transfer roller, or an electrical noise associated with a commercial power supply, works as a vibration noise, which is then superimposed on a measuring signal.

It is noted that Patent document 1 describes techniques regarding a weighing device, and Patent document 2 describes techniques regarding a digital filter. Further, Non-patent document 1 describes a solution to an optimization problem.

Patent document 1: Japanese Patent Application Laid-Open No. 2004-150883
Patent document 2: Japanese Patent Application Laid-Open No. 2007-129408
Non-patent document 1: J. F. Sturm, "Using sedumi 1.02, A MATLAB toolbox for optimization over symmetric cones (Updated for Version 1.05)", Optimiz. Methods and Syst. II, 1999, Vol. 11-12, pp. 625-653

As described above, since a natural frequency of a weight sensor is subject to a weight of an article and a tare, the frequency or the level of a natural frequency noise changes as the weight of the article or the tare changes. Conventionally, a tare, e.g., a weight of a conveyor, has been a predominating factor, and thus, change in the frequency or level of a natural frequency noise which is caused by change in the weight of the article has been negligible. However, in recent years, with a demand for more accurate measurement of a weight of a lighter article, there is a trend toward a smaller tare, so that such change in the frequency or level of the natural frequency noise as noted above has become too significant to neglect.

Further, the frequency or level of a vibration noise associated with a motor or a transfer roller changes in accordance with specifications of a transfer system such as a transfer speed, for example. For this reason, it is desired to design a digital filter which is capable of easily canceling a vibration noise even if the frequency or level of a vibration noise changes due to change in the type or size of an object under measurement, or change in specifications of a transfer system.

DESCRIPTION OF THE INVENTION

The present invention has been made in view of the foregoing problems, and it is an object of the present invention to provide techniques which allow for easier change in filter characteristics of a digital filter.

In order to solve the above-described problems, the first aspect of a noise canceling device of the present invention includes: a signal processor for carrying out a filtering process on a digital signal using a variable filter coefficient; and a filter coefficient calculator for calculating the filter coefficient using a predetermined mathematical expression and outputting the filter coefficient to the signal processor, wherein the mathematical expression includes a first parameter which specifies an amount of attenuation in at least one attenuation band where attenuation should be locally intensified in a stopband of amplitude characteristics of the filtering process, and the filter coefficient calculator changes the filter coefficient by substituting an input value of the first parameter into the mathematical expression, so that the amount of attenuation in the at least one attenuation band is changeable to a desired amount of attenuation which is specified by the first parameter.

Also, the second aspect of the noise canceling device of the present invention is the first aspect wherein the mathematical expression further includes a second parameter which specifies a band position of the at least one attenuation band, and the filter coefficient calculator changes the filter coefficient by substituting an input value of the second parameter into the mathematical expression, so that the band position of the at least one attenuation band is changeable to a desired band position which is specified by the second parameter.

Also, the third aspect of the noise canceling device of the present invention is the second aspect wherein the first parameter is a parameter which specifies respective amounts of attenuation in plural attenuation bands where attenuation should be locally intensified in the stopband, the second parameter is a parameter which specifies respective band positions of the plural attenuation bands, the filter coefficient calculator changes the filter coefficient by substituting an input value of the first parameter into the mathematical expression, so that the respective amounts of attenuation in the plural attenuation bands are individually changeable to desired amounts of attenuation which are specified by the first parameter, and the filter coefficient calculator changes the filter coefficient by substituting an input value of the second parameter into the mathematical expression, so that the respective band positions of the plural attenuation bands are individually changeable to desired band positions which are specified by the second parameter.

Also, the fourth aspect of the noise canceling device of the present invention is the first or second aspect wherein the mathematical expression further includes a third parameter which specifies a starting frequency of the stopband, the filter coefficient calculator changes the filter coefficient by substituting an input value of the third parameter into the mathematical expression, so that the starting frequency of the stopband is changeable to a desired frequency which is specified by the third parameter.

Also, the fifth aspect of the noise canceling device of the present invention is the third aspect wherein the mathematical expression further includes a third parameter which specifies a starting frequency of the stopband, the filter coefficient calculator changes the filter coefficient by substituting an input value of the third parameter into the mathematical expression, so that the starting frequency of the stopband is changeable to a desired frequency which is specified by the third parameter.

Also, the sixth aspect of the noise canceling device of the present invention is the third aspect wherein an amount of deviation from a center frequency of a range within which each of the respective band positions of the plural attenuation bands varies is given as the second parameter.

Also, the seventh aspect of the noise canceling device of the present invention is the fifth aspect wherein an amount of deviation from a center frequency of a range within which each of the respective band positions of the plural attenuation bands varies is given as the second parameter, and an amount of deviation from a center frequency of a range within which the starting frequency of the stopband varies is given as the third parameter.

Also, the eighth aspect of the noise canceling device of the present invention includes: a signal processor for carrying out a filtering process on a digital signal using a variable filter coefficient; and a filter coefficient calculator for calculating the filter coefficient using a predetermined mathematical expression and outputting the filter coefficient to the signal processor, wherein the mathematical expression includes a first parameter which specifies a starting frequency of a stopband of amplitude characteristics of the filtering process, and the filter coefficient calculator changes the filter coefficient by substituting an input value of the first parameter into the mathematical expression, so that the starting frequency of the stopband is changeable to a desired frequency which is specified by the first parameter.

Also, the ninth aspect of the noise canceling device of the present invention is the eighth aspect wherein the mathematical expression includes a second parameter which specifies a band position of at least one attenuation band where attenuation should be locally intensified in the stopband, and the filter coefficient calculator changes the filter coefficient by substituting an input value of the second parameter into the mathematical expression, so that the band position of the at least one attenuation band is changeable to a desired band position which is specified by the second parameter.

Also, the tenth aspect of the noise canceling device of the present invention is the ninth aspect wherein the second parameter is a parameter which specifies respective band positions of attenuation in plural attenuation bands where attenuation should be locally intensified in the stopband, and the filter coefficient calculator changes the filter coefficient by substituting an input value of the second parameter into the mathematical expression, so that the respective band positions of the plural attenuation bands are individually changeable to desired band positions which are specified by the second parameter.

Also, the eleventh aspect of the noise canceling device is the tenth aspect wherein an amount of deviation from a center frequency of a range within which each of the respective band positions of the plural attenuation bands varies is given as the second parameter.

Also, the twelfth aspect of the noise canceling device of the present invention is the eleventh aspect wherein an amount of deviation from a center frequency of a range within which the starting frequency of the stopband varies is given as the first parameter.

Also, a weighing device of the present invention includes: any of the first through twelfth aspects of the noise canceling device; and a measuring part for detecting a weight of an object under measurement, wherein the noise canceling device carries out the filtering process on a digital signal which is obtained as a result of measurement in the measuring part.

The first aspect of a method of canceling a noise of the present invention includes the steps of: (a) calculating a filter coefficient using a predetermined mathematical expression; and (b) carrying out a filtering process on a digital signal using the filter coefficient which is calculated in the step (a), wherein the mathematical expression includes a parameter which specifies an amount of attenuation in at least one attenuation band where attenuation should be locally intensified in a stopband of amplitude characteristics of the filtering process, the step (a) includes a step of (a-1) changing the filter coefficient by substituting a value of the parameter into the mathematical expression, and the amount of attenuation in the at least one attenuation band is changed to a desired amount of attenuation which is specified by the parameter by performing the step (a-1).

Also, the second aspect of the method of canceling a noise of the present invention includes the steps of: (a) calculating a filter coefficient using a predetermined mathematical expression; and (b) carrying out a filtering process on a digital signal using the filter coefficient which is calculated in the step (a), wherein the mathematical expression includes a parameter which specifies a starting frequency of a stopband of amplitude characteristics of the filtering process, the step (a) includes a step of (a-1) changing the filter coefficient by substituting a value of the parameter into the mathematical expression, and the starting frequency of the stopband is changed to a desired frequency which is specified by the parameter by performing the step (a-1).

Also, the first aspect of a method of designing a digital filter of the present invention is a method of designing a digital filter in which an amount of attenuation in at least one attenuation band where attenuation should be locally intensified in a stopband of amplitude characteristics is variable, and the method includes the steps of: (a) approximating a filter coefficient of the digital filter by a predetermined mathematical expression including a parameter which specifies the amount of attenuation in the at least one attenuation band, based on reference amplitude characteristics of the digital filter; and (b) calculating the filter coefficient using the mathematical expression, wherein the step (b) includes a step of (b-1) changing the filter coefficient by substituting a value of the parameter into the mathematical expression, and the amount of attenuation in the at least one attenuation band is changed to a desired amount of attenuation which is specified by the parameter by performing the step (b-1).

Also, the second aspect of the method of designing a digital filter of the present invention is a method of designing a digital filter in which a starting frequency of a stopband is variable, and the method includes the steps of: (a) approximating a filter coefficient of the digital filter by a predetermined mathematical expression including a parameter which specifies the starting frequency of the stopband, based on reference amplitude characteristics of the digital filter; and (b) calculating the filter coefficient using the mathematical expression, wherein the step (b) includes a step of (b-1) changing the filter coefficient by substituting a value of the parameter into the mathematical expression, and the starting frequency of the stopband is changed to a desired frequency which is specified by the parameter by performing the step (b-1).

According to the first aspect of the noise canceling device of the present invention, the first aspect of the noise canceling method of the present invention, and the first aspect of the method of designing a digital filter of the present invention, the filter coefficient can be changed by using the parameter which specifies an amount of attenuation in an attenuation band where attenuation should be locally intensified. Thus, it is possible to easily change the amount of attenuation in the attenuation band. Therefore, a noise can be surely cancelled.

Also, according to the second and ninth aspects of the noise canceling device of the present invention, the filter coefficient can be changed by using the parameter which specifies the band position of the attenuation band where attenuation should be locally intensified in the stopband. Thus, also the band position of the attenuation band can be easily changed.

Also, according to the third aspect of the noise canceling device of the present invention, the respective amounts of attenuation in the plural attenuation bands and the respective band positions of the plural attenuation bands can be specified. Thus, even if there are plural factors of occurrence of a noise and the factors vary, a noise can be surely cancelled.

Also, according to the fourth and fifth aspects of the noise canceling device of the present invention, the filter coefficient can be changed by using the parameter which specifies the starting frequency of the stopband. Thus, also the starting frequency of the stopband can be easily changed.

Also, according to the sixth, seventh, eleventh, and twelfth aspects of the noise canceling device of the present invention, it is possible to approximate plural parameters in the same manner in calculating the filter coefficient, to thereby achieve a design of a desired filter.

Also, according to the eighth aspect of the noise canceling device of the present invention, the second aspect of the noise canceling method of the present invention, and the second aspect of the method of designing a digital filter of the present invention, the filter coefficient can be changed by using the parameter which specifies the starting frequency of the stopband. Thus, it is possible to easily change the starting frequency of the stopband. Therefore, a noise can be surely cancelled.

Also, according to the tenth aspect of the noise canceling device of the present invention, respective band positions of plural attenuation bands can be specified. Thus, even if there are plural factors of occurrence of a noise and the factors vary, a noise can be surely canceled.

According to the weighing device of the present invention, highly accurate weighing is possible.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a block diagram showing a structure of a weighing device according to the preferred embodiment of the present invention.

FIG. 2 is a view for showing an example of amplitude characteristics of a filtering process carried out in a signal processor according to the preferred embodiment of the present invention.

FIG. 3 is a flow chart showing operations for weighing in the weighing device according to the preferred embodiment of the present invention.

FIG. 4 is a view for showing ideal filter characteristics.

FIG. 15 is a view for showing another example of amplitude characteristics of a filtering process carried out in the signal processor according to the preferred embodiment of the present invention.

FIG. 16 is a view for showing another example of amplitude characteristics of a filtering process carried out in the signal processor according to the preferred embodiment of the present invention.

FIG. 19 is a view for showing another example of amplitude characteristics of a filtering process carried out in the signal processor according to the preferred embodiment of the present invention.

FIG. 20 is a view for showing another example of amplitude characteristics of a filtering process carried out in the signal processor according to the preferred embodiment of the present invention.

FIG. 21 is a view for showing another example of amplitude characteristics of a filtering process carried out in the signal processor according to the preferred embodiment of the present invention.

FIG. 22 is a view for showing another example of amplitude characteristics of a filtering process carried out in the signal processor according to the preferred embodiment of the present invention.

FIG. 23 is a view for showing another example of amplitude characteristics of a filtering process carried out in the signal processor according to the preferred embodiment of the present invention.

FIG. 24 is a view for showing another example of amplitude characteristics of a filtering process carried out in the signal processor according to the preferred embodiment of the present invention.

FIG. 25 is a view for showing another example of amplitude characteristics of a filtering process carried out in the signal processor according to the preferred embodiment of the present invention.

FIG. 26 is a view for showing another example of amplitude characteristics of a filtering process carried out in the signal processor according to the preferred embodiment of the present invention.

FIG. 27 is a view for showing another example of amplitude characteristics of a filtering process carried out in the signal processor according to the preferred embodiment of the present invention.

FIG. 28 is a view for showing another example of amplitude characteristics of a filtering process carried out in the signal processor according to the preferred embodiment of the present invention.

FIG. 31 is a view for showing another example of amplitude characteristics of a filtering process carried out in the signal processor according to the preferred embodiment of the present invention.

FIG. 32 is a view for showing another example of amplitude characteristics of a filtering process carried out in the signal processor according to the preferred embodiment of the present invention.

FIG. 33 is a view for showing another example of amplitude characteristics of a filtering process carried out in the signal processor according to the preferred embodiment of the present invention.

FIG. 34 is a view for showing another example of amplitude characteristics of a filtering process carried out in the signal processor according to the preferred embodiment of the present invention.

FIG. 35 is a view for showing another example of amplitude characteristics of a filtering process carried out in the signal processor according to the preferred embodiment of the present invention.

FIG. 36 is a view for showing another example of amplitude characteristics of a filtering process carried out in the signal processor according to the preferred embodiment of the present invention.

FIG. 39 is a view for showing another example of amplitude characteristics of a filtering process carried out in the signal processor according to the preferred embodiment of the present invention.

FIG. 40 is a view for showing another example of amplitude characteristics of a filtering process carried out in the signal processor according to the preferred embodiment of the present invention.

FIG. 41 is a view for showing another example of amplitude characteristics of a filtering process carried out in the signal processor according to the preferred embodiment of the present invention.

FIG. 42 is a view for showing another example of amplitude characteristics of a filtering process carried out in the signal processor according to the preferred embodiment of the present invention.

FIG. 43 is a view for showing another example of amplitude characteristics of a filtering process carried out in the signal processor according to the preferred embodiment of the present invention.

FIG. 44 is a view for showing another example of amplitude characteristics of a filtering process carried out in the signal processor according to the preferred embodiment of the present invention.

FIG. 45 is a view for showing another example of amplitude characteristics of a filtering process carried out in the signal processor according to the preferred embodiment of the present invention.

FIG. 46 is a view for showing another example of amplitude characteristics of a filtering process carried out in the signal processor according to the preferred embodiment of the present invention.

FIG. 47 is a view for showing another example of amplitude characteristics of a filtering process carried out in the signal processor according to the preferred embodiment of the present invention.

FIG. 48 is a view for showing another example of amplitude characteristics of a filtering process carried out in the signal processor according to the preferred embodiment of the present invention.

BEST MODE FOR CARRYING OUT THE INVENTION

Figure 5:
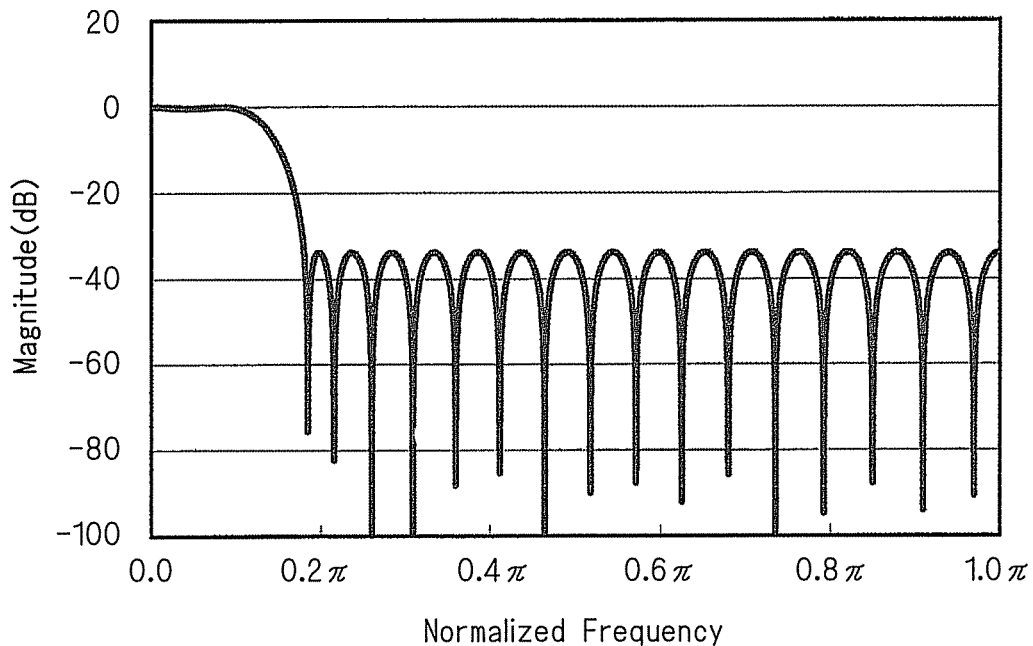
FIG. 5 is a view for showing another example of amplitude characteristics of a filtering process carried out in the signal processor according to the preferred embodiment of the present invention.

FIG. 1 is a block diagram for showing a structure of a weighing device according to the preferred embodiment of the present invention. As shown in FIG. 1, the weighing device according to the preferred embodiment of the present invention includes a weight sensor 1 such as a load cell of strain gauge type and a force balance, an amplifier 2, an analog filter 3, an A/D converter (which will be hereinafter abbreviated to "ADC") 4, a signal processor 5, a filter coefficient calculator 6, a data entry part 7, and a coefficient storage 8.

The weight sensor 1 detects a weight of an object under measurement which is provided from a measuring system, and outputs the result to the amplifier 2, as a measuring signal ms. The amplifier 2 amplifies the input measuring signal ms, and outputs a resultant signal to the analog filter 3, as an amplified signal MS. The analog filter 3 removes an unnecessary higher component from the amplified signal MS, to output a resultant signal, as an analog signal As. The ADC 4 samples the analog signal As output from the analog filter 3 with a predetermined sampling period, to output a digital signal which has been quantized at a predetermined quantization bit number to the signal processor 5, as a weight signal Ds.

The signal processor 5 carries out a filtering process on the input weight signal Ds using a filter of finite impulse response (FIR) type (which will be hereinafter referred to as an "FIR filter"), and outputs the result to a microcomputer which is not shown, as a signal Xs. Then, the microcomputer calculates a weight of the object under measurement based on the signal Xs, and displays the weight of the object under measurement on a display part which is also not shown.

In this regard, it is noted that generally, a frequency response $H(e^{j\omega})$ of a 2Nth-order FIR filter is given by the following expression (1).

[Expression 1]

$$H(e^{j\omega}) = \sum_{i=0}^{N} h_i \cos(i\omega) \quad (1)$$

In the expression (1), "$h_i$(i=0, 1, 2, ... N)" represents a filter coefficient. Also, "$\omega$" represents a normalized angular frequency, that is, an angular frequency normalized at a sampling frequency which is used for a filtering process on data. Thus, in the preferred embodiment of the present invention, an angular frequency which is normalized at a sampling frequency used for a filtering process on data in the signal processor 5 is a normalized angular frequency. Hereinafter, the terms "normalized angular frequency" will mean such an angular frequency as defined above, i.e., an angular frequency which is normalized at a sampling frequency.

The filter coefficient calculator 6 calculates a sequence $\{h_i\}$ of the filter coefficient $h_i$ in the above expression (1) using a predetermined mathematical expression which will be later described in detail, and outputs the result to the signal processor 5.

FIG. 2 is a view for showing an example of amplitude characteristics of a filtering process in the signal processor 5. As shown in FIG. 2, an FIR filter used in the signal processor 5 is a low pass filter. The weighing device according to the preferred embodiment of the present invention can provide k($\geq$1) attenuation bands 9 where attenuation is locally great in a stopband 10 of the amplitude characteristics of the FIR filter used in the signal processor 5, and has a function of changing the respective band positions of the attenuation bands 9. More specifically, the weighing device has a function of moving the positions of the attenuation bands 9 to a higher frequency region or a lower frequency region. Also, the weighing device according to the present preferred embodiment has a function of changing the amounts of attenuation in the attenuation bands 9. Further, when k$\geq$2, the weighing device according to the present preferred embodiment has a function of changing the respective band positions of the plural attenuation bands 9 individually, and a function of changing the respective amounts of attenuation in the plural attenuation bands 9 individually. Moreover, the weighing device according to the present preferred embodiment has a function of changing a starting frequency of the stopband 10. It is additionally noted that the terms "attenuation band" will hereinafter mean a band where attenuation should be locally intensified in a stopband, like the attenuation bands 9 shown in FIG. 2.

The filter coefficient calculator 6 calculates the sequence $\{h_i\}$ of the filter coefficient $h_i$ in the above expression (1) using the following expression (2), and outputs the result to the signal processor 5.

[Expression 2]

$$h_i = h(i, v, \delta_1, \delta_2, \ldots, \delta_k, \phi_1, \phi_2, \ldots, \phi_k) = \quad (2)$$
$$\sum_{l_S=0}^{L_S} \sum_{l_{C1}=0}^{L_{C1}} \sum_{l_{C2}=0}^{L_{C2}} \cdots \sum_{l_{Ck}=0}^{L_{Ck}} \sum_{l_{W1}=0}^{L_{W1}} \sum_{l_{W2}=0}^{L_{W2}} \cdots$$
$$\sum_{l_{Wk}=0}^{L_{Wk}} g(i, l_S, l_{C1}, l_{C2}, \ldots, l_{Ck}, l_{W1}, l_{W2}, \ldots, l_{Wk})$$
$$v^{l_S} \delta_1^{l_{C1}} \delta_2^{l_{C2}} \cdots \delta_k^{l_{Ck}} \phi_1^{l_{W1}} \phi_2^{l_{W2}} \cdots \phi_k^{l_{Wk}}$$

In the expression (2), "g(i, $l_S$, $l_{C1}$, $l_{C2}$, ... $l_{Ck}$, $l_{W1}$, $l_{W2}$, ... $l_{Wk}$)" represents a coefficient. Also, "v" represents a parameter which specifies a starting frequency of the stopband, and "$\delta_1$-$\delta_k$" represent parameters which respectively specify the band positions of the k attenuation bands, "$\phi_1$-$\phi_k$" represent parameters which respectively specify the amounts of attenuation in the k attenuation bands. As shown by the expression (2), the filter coefficient $h_i$ is represented by a polynomial relative to the parameters v, $\delta_1$-$\delta_k$, and $\phi_1$-$\phi_k$. Further, "$L_s$" represents the order of the parameter v, "$L_{C1}$-$L_{Ck}$" represent the respective orders of the parameters $\delta_1$-$\delta_k$, and "$L_{W1}$-$L_{Wk}$" represent the respective orders of the parameters $\phi_1$-$\phi_k$. Hereinafter, the coefficient g(i, $l_S$, $l_{C1}$, $l_{C2}$, ... $l_{Ck}$, $l_{W1}$, $l_{W2}$, ... $l_{Wk}$) may be simply referred to as a "coefficient g".

The coefficient storage 8 is a read-only memory (ROM), for example, and a value of the coefficient g is previously stored in the coefficient storage 8. Then, a value of the coefficient g is read out from the coefficient storage 8 by the filter coefficient calculator 6.

The data entry part 7 is formed of a keyboard, for example, and receives inputs of respective values of the parameters v, $\delta_1$-$\delta_k$, and $\phi_1$-$\phi_k$ which are externally provided to the weighing device by a user, individually. Then, the data entry part 7 outputs the received values of the parameters v, $\delta_1$-$\delta_k$, and $\phi_1$-$\phi_k$ to the filter coefficient calculator 6.

As described above, according to the present preferred embodiment, the signal processor 5, the filter coefficient calculator 6, the data entry part 7, and the coefficient storage 8 forms a noise canceling device for canceling a noise contained in the weight signal Ds.

Next, operations for weighing an object under measurement in the weighing device according to the present preferred embodiment will be described with reference to FIG. 3. It is noted that since a filtering process is carried out on the weight signal Ds for achieving weighing, a method of canceling a noise in the weight signal Ds is shown in FIG. 3.

As shown in FIG. 3, the weighing device is powered up in a step s1, and subsequently, the filter coefficient calculator 6 reads out a value of the coefficient g from the coefficient storage 8 in a step s2. Then, the filter coefficient calculator 6 reads out respective initial values of the parameters ν, $\delta_1$-$\delta_k$, and $\phi_1$-$\phi_k$ which are previously stored therein.

Thereafter, the filter coefficient calculator 6 substitutes the values of the coefficient g and the parameters ν, $\delta_1$-$\delta_k$, and $\phi_1$-$\phi_k$ into the expression (2), to calculate a given sequence $\{h_i\}$ of the filter coefficient $h_i$, which is then output to the signal processor 5, in a step s3. As a result, the respective band positions of the k attenuation bands in filter characteristics in the signal processor 5 are set to the initial values specified by the parameters $\delta_1$-$\delta_k$, and also, the respective amounts of attenuation of the k attenuation bands are set to the initial values specified by the parameters $\phi_1$-$\phi_k$. Further, a starting frequency of a stopband in the filter characteristics in the signal processor 5 is set to the initial value specified by the parameter ν. In this regard, since the mathematical expression (2) regarding the filter coefficient $h_i$ is given by a polynomial, the filter coefficient $h_i$ can be promptly calculated.

In a next step s4, the signal processor 5 carries out a filtering process on the weight signal Ds using the given sequence $\{h_i\}$ of the filter coefficient $h_i$, which is calculated in the step s3. Then, the signal processor 5 outputs the result of the filtering process to the microcomputer, as the signal Xs, and the microcomputer displays the weight of the object under measurement on the display part such as a CRT.

In a next step s5, the data entry part 7, upon receipt of at least one of the values of the parameters ν, $\delta_1$-$\delta_k$, and $\phi_1$-$\phi_k$ which are input by a user of the weighing device, outputs the received value to the filter coefficient calculator 6. Change in the type or the size of an object under measurement, or change in the specifications of the transfer system, would involve change in the frequency or the level of a noise contained in the weight signal Ds, as described above. As such, a user inputs at least one of the values of the parameters ν, $\delta_1$-$\delta_k$, and $\phi_1$-$\phi_k$ in order to surely cancel such a possible noise as noted above. For example, change in the type of an object under measurement would cause change in a natural frequency of the weight sensor 1. Taking such matter into consideration, information about a natural frequency of the weight sensor 1 is previously provided for each type of an object under measurement. Then, when the type of an object under measurement is changed, a user inputs the values of the parameters $\delta_1$-$\delta_k$ to the data entry part 7, while referring to the information.

Alternatively, though the weighing device according to the present preferred embodiment is configured to require a data entry process of the values of the parameters ν, $\delta_1$-$\delta_k$, and $\phi_1$-$\phi_k$, the values of the parameters ν, $\delta_1$-$\delta_k$, and $\phi_1$-$\phi_k$ may be automatically determined in the weighing device. For example, in a measuring device such as a weight checker, in which a frequency which is required to be attenuated is determined by determining the speed of a conveyor, the values of the parameters ν, $\delta_1$-$\delta_k$, and $\phi_1$-$\phi_k$ can be automatically determined. Otherwise, in another employable configuration, frequency analysis of the waveform of vibration of a measuring signal is carried out by an FFT or the like, to detect a point with the maximum amplitude, and then the values of the parameters ν, $\delta_1$-$\delta_k$, and $\phi_1$-$\phi_k$ are automatically determined.

In a next step s6, the filter coefficient calculator 6 substitutes the received values of the parameters ν, $\delta_1$-$\delta_k$, $\phi_1$-$\phi_k$ into the expression (2), to change the given sequence $\{h_i\}$ of the filter coefficient $h_i$. Then, the filter coefficient calculator 6 outputs a new sequence $\{h_i\}$ of the filter coefficient $h_i$ to the signal processor 5. As a result, each of the band positions of the attenuation bands, each of the amounts of attenuation in the attenuation bands, or a starting frequency of the stopband in the filter characteristics in the signal processor 5 is changed to the value specified by the corresponding parameter. Thereafter, the signal processor 5 carries out a filtering process using the new sequence $\{h_i\}$ of the filter coefficient $h_i$ which is obtained by change in the sequence $\{h_i\}$ of the filter coefficient $h_i$ in the step s6, and outputs the result of the filtering process as the signal Xs, in a step s7.

In a case where the filter characteristics in the signal processor 5 must be re-changed, a user inputs at least one of the values of the parameters ν, $\delta_1$-$\delta_k$, and $\phi_1$-$\phi_k$ to the data entry part 7. Then, the steps s6 and s7 are performed, to change the filter characteristics in accordance with the input value of the parameter.

Next, a method of determining a value of the coefficient g will be described. At first, consider a situation in which ideal filter characteristics as shown in FIG. 4 are given to an FIR filter in which an amount of attenuation in an attenuation band, the band position of the attenuation band, and a starting frequency of a stopband are variable. A horizontal axis and a vertical axis in FIG. 4 respectively represent a normalized angular frequency and amplitude. Also, "$\omega_p$" in FIG. 4 represents a normalized angular frequency at the end of a passband, that is, a normalized angular frequency at a terminal point of a passband. Further, "$\omega_s$" represents a normalized center angular frequency of a range within which a starting point of the stopband can vary. Moreover, "$\tau_1$-$\tau_k$" in FIG. 4 represent respective bandwidths of k attenuation bands. Furthermore, "$\phi_1$-$\phi_k$" represent respective normalized center angular frequencies of ranges within which the band positions of the k attenuation bands can respectively vary.

According to the present preferred embodiment, an amount of deviation (an amount of shift) from $\omega_s$ is input to the parameter ν which specifies a starting frequency of a stopband. Also, amounts of deviation from $\phi_1$-$\phi_k$ are input to the parameters $\delta_1$-$\delta_k$ which specify the band positions of attenuation bands, respectively. Then, the proportion to the amount of attenuation in regions other than attenuation bands in the stopband is input to each of the parameters $\phi_1$-$\phi_k$ which specify respective amounts of attenuation in attenuation bands.

As described above, according to the preferred embodiment, as the parameter ν, an amount of deviation from a center frequency of a range within which a starting frequency of a stopband can vary is given, and as each of the parameters $\delta_1$-$\delta_k$, an amount of deviation from a center frequency of a range within which the band position of a corresponding attenuation band can vary is given.

Secondly, with respect to the ideal filter characteristics shown in FIG. 4, consider the following reference amplitude characteristics D ($\omega$, ν, $\delta_1$, $\delta_2$, ..., $\delta_k$) as ideal amplitude characteristics (ideal amplitude characteristics) and the following weight function W ($\omega$, ν, $\delta_1$, $\delta_2$, ..., $\delta_k$, $\phi_1$, $\phi_2$, ..., $\phi_k$).

[Expression 3]

$$D(\omega, v, \delta_1, \delta_2, \ldots, \delta_k) = \begin{cases} 1 & 0 \leq \omega \leq \omega_P \\ 0 & \omega_S + v \leq \omega \leq \phi_1 + \delta_1 - \tau_1/2 \\ 0 & \phi_1 + \delta_1 - \tau_1/2 < \omega \leq \phi_1 + \delta_1 + \tau_1/2 \\ 0 & \phi_1 + \delta_1 + \tau_1/2 < \omega \leq \phi_2 + \delta_2 - \tau_2/2 \\ 0 & \phi_2 + \delta_2 - \tau_2/2 < \omega \leq \phi_2 + \delta_2 + \tau_2/2 \\ \vdots & \\ 0 & \phi_k + \delta_k - \tau_k/2 < \omega \leq \phi_k + \delta_k + \tau_k/2 \\ 0 & \phi_k + \delta_k + \tau_k/2 < \omega \leq \pi \end{cases} \quad (3)$$

-continued
$$W(\omega, v, \delta_1, \delta_2, \ldots, \delta_k, \phi_1, \phi_2, \ldots, \phi_k) = \quad (4)$$
$$\begin{cases} 1 & 0 \le \omega \le \omega_P \\ 1 & \omega_S + v \le \omega \le \phi_1 + \delta_1 + \tau_1/2 \\ \phi_1 & \phi_1 + \delta_1 - \tau_1/2 < \omega \le \phi_1 + \delta_1 - \tau_1/2 \\ 1 & \phi_1 + \delta_1 - \tau_1/2 < \omega \le \phi_2 + \delta_2 - \tau_2/2 \\ \phi_2 & \phi_2 + \delta_2 - \tau_2/2 < \omega \le \phi_2 + \delta_2 + \tau_2/2 \\ \vdots \\ \phi_k & \phi_k + \delta_k - \tau_k/2 < \omega \le \phi_k + \delta_k + \tau_k/2 \\ 1 & \phi_k + \delta_k + \tau_k/2 < \omega \le \pi \end{cases}$$

However, the parameters $v$, $\delta_1$-$\delta_k$, and $\phi_1$-$\phi_k$ satisfy the following expressions.

[Expression 4]

$$v \in [v_{min}, v_{max}] \quad (5)$$

$$\delta_1 \in [\delta_{1min}, \delta_{1max}] \quad (6)$$

$$\delta_2 \in [\delta_{2min}, \delta_{2max}]$$

$$\vdots$$

$$\delta_k \in [\phi_{kmin}, \phi_{kmax}]$$

$$\phi_1 \in [\phi_{1min}, \phi_{1max}] \quad (7)$$

$$\phi_2 \in [\phi_{2min}, \phi_{2max}]$$

$$\vdots$$

$$\phi_k \in [\phi_{kmin}, \phi_{kmax}]$$

Here, the frequency response $H(e^{j\omega})$ can be expressed as follows, using the above-cited expression (2).

[Expression 5]

$$H(e^{j\omega}) = H(\omega, v, \delta_1, \delta_2, \ldots, \delta_k, \phi_1, \phi_2, \ldots, \phi_k) = \quad (8)$$
$$\sum_{i=0}^{N} h(i, v, \delta_1, \delta_2, \ldots, \delta_k, \phi_1, \phi_2, \ldots, \phi_k)\cos(i\omega)$$

Now, consider the following weighted error for amplitude characteristics $|H(\omega, v, \delta_1, \delta_2, \ldots, \delta_k, \phi_1, \phi_2, \ldots, \phi_k)|$, in order to provide weighted optimum design (minimax approximation) with the reference amplitude characteristics expressed by the expression (3) and the weighted function expressed by the expression (4).

[Expression 6]

$$e(\omega,v,\delta_1,\delta_2,\ldots,\delta_k,\phi_1,\phi_2,\ldots,\phi_k) = W(\omega,v,\delta_1,\delta_2,\ldots,\delta_k,\phi_1,\phi_2,\ldots,\phi_k)(D(\omega,v,\delta_1,\delta_2,\ldots,\delta_k) - H(\omega,v,\delta_1,\delta_2,\ldots,\delta_k,\phi_1,\phi_2,\ldots,\phi_k)) \quad (9)$$

An optimum value of the coefficient g can be obtained by calculating a value of the coefficient g which satisfies the following expression.

[Expression 7]

$$\underset{G(i,l_S,l_{C1},l_{C2},\ldots,l_{Ck},l_{W1},l_{W2},\ldots,l_{Wk})}{\text{minimize}} \quad (10)$$
$$\left[\underset{\omega \in \Omega}{\text{maximize}} e(\omega, v, \delta_1, \delta_2, \ldots, \delta_k, \phi_1, \phi_2, \ldots, \phi_k)\right]$$

However, the following expressions should be satisfied.

[Expression 8]

$$G(i, l_S, l_{C1}, l_{C2}, \ldots, l_{Ck}, l_{W1}, l_{W2}, \ldots, l_{Wk}) = \quad (11)$$
$$[g(0, 0, 0, 0, \ldots 0, 0, 0, \ldots 0)g(0, 0, 0, 0, \ldots 0, 0, 0, \ldots,$$
$$[g(0, 0, 0, \ldots 0, 0, 0, \ldots, 0)g(0, 0, 0, 0, \ldots 0, 0, 0, \ldots, 1) \ldots$$
$$g(i, l_S, l_{C1}, l_{C2}, \ldots, l_{Ck}, l_{W1}, l_{W2}, \ldots, l_{Wk}) \ldots$$
$$g(N, L_S, L_{C1}, L_{C2}, \ldots, L_{Ck}, L_{W1}, L_{W2}, \ldots, L_{Wk})]$$

$$\Omega = [0, \omega_P] \cup [\omega_S + v, \pi] \quad (12)$$

Assuming that a tolerance relative to the reference amplitude characteristics is $\lambda(\omega, v, \delta_1, \delta_2, \ldots, \delta_k, \phi_1, \phi_2, \ldots, \phi_k)$, a design problem expressed by the expression (10) is equivalent to a design problem expressed by the following expressions (13a) and (13b).

[Expression 9]

$$\text{minimize } \lambda(\omega,v,\delta_1,\delta_2,\ldots,\delta_k,\phi_1,\phi_2,\ldots,\phi_k) \quad (13a)$$

$$\text{subject to } e(\omega,v,\delta_1,\delta_2,\ldots,\delta_k,\phi_1,\phi_2,\ldots,\phi_k)^2 \le \lambda(\omega,v,\delta_1,\delta_2,\ldots,\delta_k,\phi_1,\phi_2,\ldots,\phi_k) \quad (13b)$$

The expression (13b) for constraint in the design problem can be transformed into the following expression (14).

[Expression 10]

$$\Gamma(\omega, v, \delta_1, \delta_2, \ldots, \delta_k, \phi_1, \phi_2, \ldots, \phi_k) = \quad (14)$$
$$\begin{bmatrix} \lambda(\omega, v, \delta_1, \delta_2, \ldots, \delta_k, \phi_1, \phi_2, \ldots, \phi_k) \\ e(\omega, v, \delta_1, \delta_2, \ldots, \delta_k, \phi_1, \phi_2, \ldots, \phi_k) \\ e(\omega, v, \delta_1, \delta_2, \ldots, \delta_k, \phi_1, \phi_2, \ldots, \phi_k) \\ 1 \end{bmatrix} \ge 0$$

It is obvious that the expression (14) is linear with respect to the coefficient g and the tolerance ($\omega$, $v$, $\delta_1$, $\delta_2$, ..., $\delta_k$, $\phi_1$, $\phi_2$, ..., $\phi_k$).

Now, a range of values of $\omega$, that is, a range from 0 to $\pi$ is divided into M sections, and it is assumed that $\omega=\omega_m$ (m is an integer, and $1 \le m \le M$). Also, a range of values of the parameter $v$ is divided into Q sections, and it is assumed that $v=v_q$ (q is an integer and $1 \le q \le Q$). Further, respective ranges of values of the parameters $\delta_1$-$\delta_k$ are divided into T1-Tk sections, and it is assumed that $\delta_1 = \delta_{1,t1}$ (t1 is an integer and $1 \le t1 \le T1$), $\delta_2 = \delta_{2,t2}$ (t2 is an integer and $1 \le t2 \le T2$), ... and $\delta_k = \delta_{k,tk}$ (tk is an integer and $1 \le tk \le Tk$). Moreover, respective ranges of values of the parameters $\phi_1$-$\phi_k$ are divided into R1-Rk sections, and it is assumed that $\phi_1 = \phi_{1,r1}$ ($1 \le r1 \le R$), $\phi_2 = \phi_{2,r2}$ ($1 \le r2 \le R$), ..., and $\phi_k = \phi_{k,rk}$ ($1 \le rk \le Rk$). Then, $\Gamma(\omega, v, \delta_1, \delta_2, \ldots, \delta_k, \phi_1, \phi_2, \ldots, \phi_k)$ can be transformed into the following expression.

[Expression 11]

$$U(x) = \quad (15)$$
$$\text{diag}[\Gamma(\omega_1, v_1, \delta_{1,1}, \delta_{2,1}, \ldots, \delta_{k,1}, \phi_{1,1}, \phi_{2,1}, \ldots, \phi_{k,1}) \ldots \Gamma(\omega_m,$$
$$v_q, \delta_{1,t1}, \delta_{2,t2}, \delta_{2,t2}, \ldots, \delta_{k,tk}, \phi_{1,r1}, \phi_{2,r2}, \ldots, \phi_{k,rk}) \ldots$$
$$(\omega_M, v_Q, \delta_{1,T1}, \delta_{2,T2}, \ldots, \delta_{k,Tk}, \phi_{1,R1}, \phi_{2,R2}, \ldots, \phi_{k,Rk})]$$

In the above expression, "diag[·]" is a diagonal matrix in which values in [·] are elements.

Therefore, the expressions (13a) and (13b) can be transformed into the following expressions (16a) and (16b), respectively.

[Expression 12]

$$\text{minimize } d^T x \quad (16a)$$

$$\text{subject to } U(x) \geq 0 \quad (16b)$$

However, the following expressions should be satisfied.

[Expression 13]

$$d = \begin{bmatrix} \left[\underbrace{1 \ldots 1}_{QT_1 \ldots T_k R_1 \ldots R_k}\right]^T \\ \underbrace{0 \ldots 0}_{N(L_S+1)(L_{C1}+1)(L_{C2}+1)\ldots(L_{Ck}+1)(L_{W1}+1)(L_{W2})\ldots(L_{Wk}+1)} \end{bmatrix} \quad (17)$$

$$x = [\lambda(\omega_1, \nu_1, \delta_{1,1}, \delta_{2,1}, \ldots, \delta_{k,1}, \phi_{1,1}, \phi_{2,1}, \ldots, \phi_{k,1}) \ldots \quad (18)$$
$$\lambda(\omega_m, \nu_q, \delta_{1,t1}, \delta_{2,t2}, \ldots, \delta_{k,tk}, \phi_{1,r1}, \phi_{2,r2}, \ldots, \phi_{k,rk}) \ldots$$
$$\lambda(\omega_M, \nu_Q, \delta_{1,T1}, \delta_{2,T2}, \ldots, \delta_{k,Tk}, \phi_{1,R1}, \phi_{2,T2}, \ldots, \phi_{k,Rk})$$
$$G(i, l_S, l_{C1}, l_{C2}, \ldots, l_{Ck}, l_{W1}, l_{W2}, \ldots, l_{Wk})^T]$$

"U(x)" is linear with respect to x and a design problem expressed by the expressions (16a) and (16b) are a problem of a positive semi definite. Thus, to solve this problem could obtain an optimum value of the coefficient g. Additionally, a problem of a positive semi definite can be solved by utilizing the techniques described in the above-cited non-patent document 1, for example. In the coefficient storage 8 according to the present preferred embodiment, an optimum value of the coefficient g which is obtained as described above is previously stored. This allows the parameter ν to specify a starting frequency of a stopband, allows the parameters $\delta_1$-$\delta_k$ to specify the band positions of attenuation bands, and allows the parameters $\phi_1$-$\phi_k$ to specify the amounts of attenuation in attenuation bands.

For the parameters ν, $\delta_1$-$\delta_k$, and $\phi_1$-$\phi_k$, a user can input any value from the ranges represented by the expressions (5), (6), and (7) via the data entry part 7. For example, assuming that $\nu_{min}$=−0.1π and $\nu_{max}$=0.1π, a user can input any value from −0.1π to 0.1π as a value of the parameter ν. Then, when ν is set to −0.05π, a starting frequency of a stopband is determined to be ($\omega_s$−0.05π). On the other hand, assuming that $\delta_{1min}$=−0.1π and $\delta_{1max}$=0.1π, a user can input any value from −0.1π to 0.1π as a value of the parameter $\delta_1$. Then, when $\delta_1$ is set to −0.05π, its corresponding attenuation band occupies a frequency range from ($\phi_1$−0.05π−$\tau_1$/2) to ($\phi_1$−0.05π+$\tau_1$/2). Further, assuming that $\phi_{1min}$=1 and $\phi_{1max}$=1000, a user can input any value from 1 to 1000 as a value of the parameter $\phi_1$. Then, when $\phi_1$ is set to 100, an amount of attenuation in its corresponding attenuation band is 100 times the amount of attenuation in regions other than the k attenuation bands in a stopband.

Additionally, by replacing the parameter ν with a constant in the above mathematical expression (2) for calculating the filter coefficient $h_i$, it is possible to fix a starting frequency of a stopband. Also, by replacing each of the parameters $\delta_1$-$\delta_k$ with a constant, it is possible to fix each of the band positions of the k attenuation bands. Further, by replacing each of the parameters $\phi_1$-$\phi_k$ with a constant, it is possible to fix the amount of attenuation in each of the k attenuation bands. Consequently, the number of parameters included in the mathematical expression (2) can be adjusted as needed.

Figure 6:
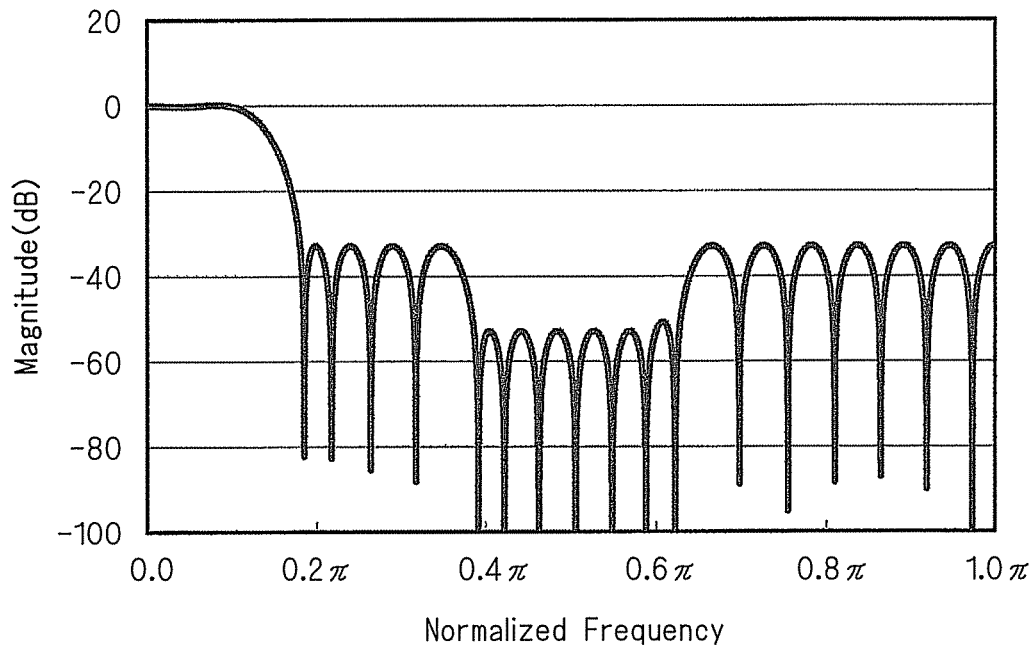
FIG. 6 is a view for showing another example of amplitude characteristics of a filtering process carried out in the signal processor according to the preferred embodiment of the present invention.
Figure 7:
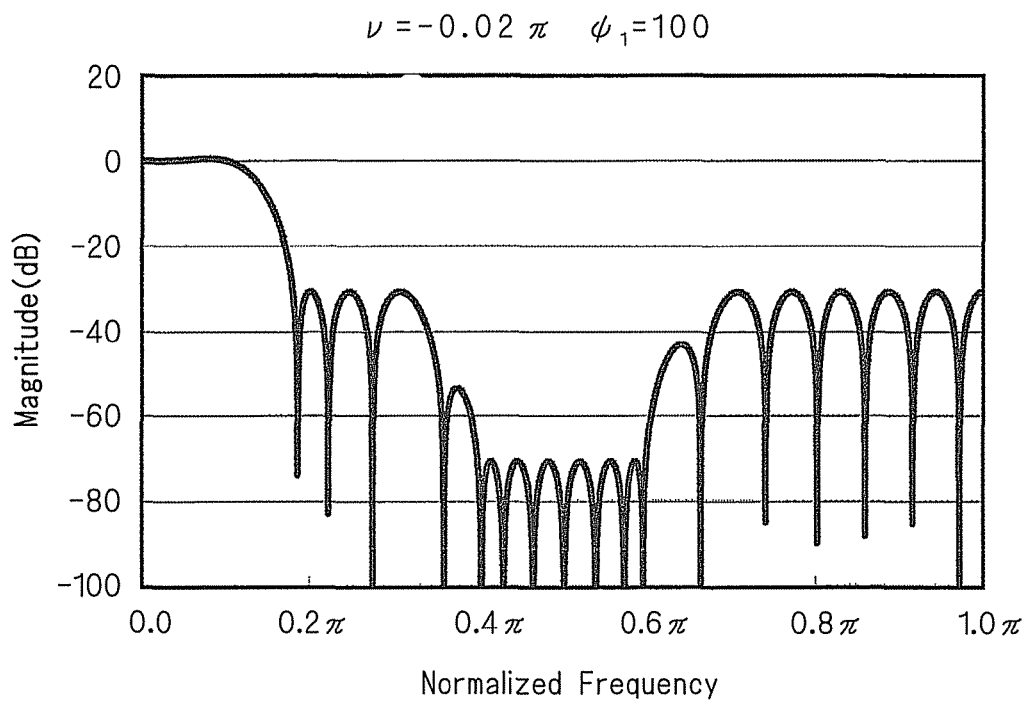
FIG. 7 is a view for showing another example of amplitude characteristics of a filtering process carried out in the signal processor according to the preferred embodiment of the present invention.
Figure 8:
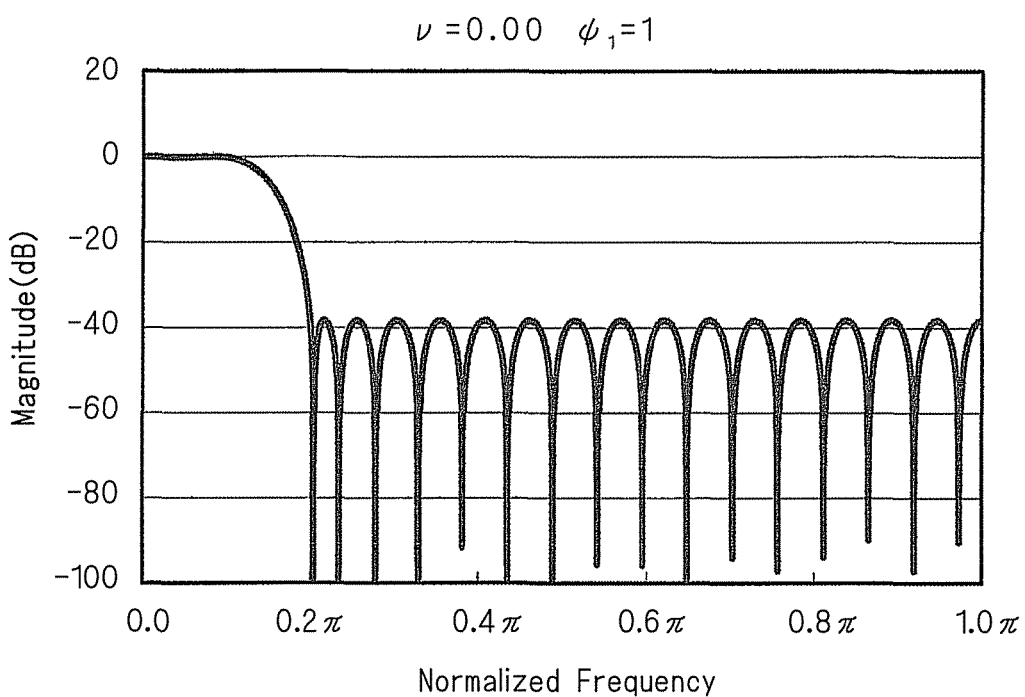
FIG. 8 is a view for showing another example of amplitude characteristics of a filtering process carried out in the signal processor according to the preferred embodiment of the present invention.
Figure 9:
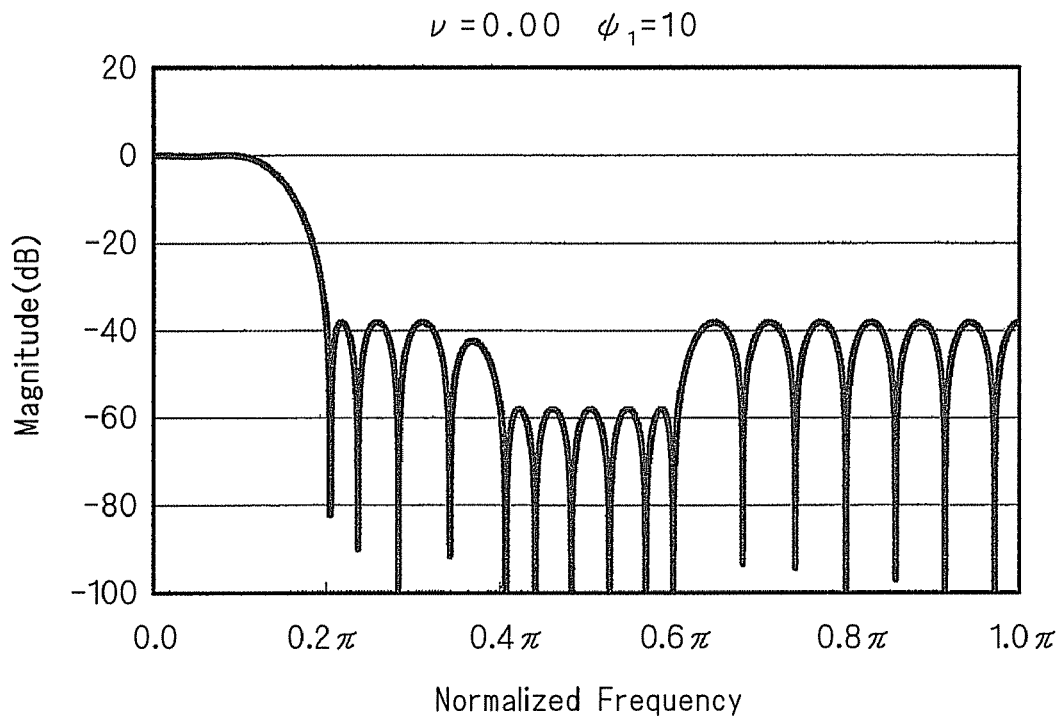
FIG. 9 is a view for showing another example of amplitude characteristics of a filtering process carried out in the signal processor according to the preferred embodiment of the present invention.
Figure 10:
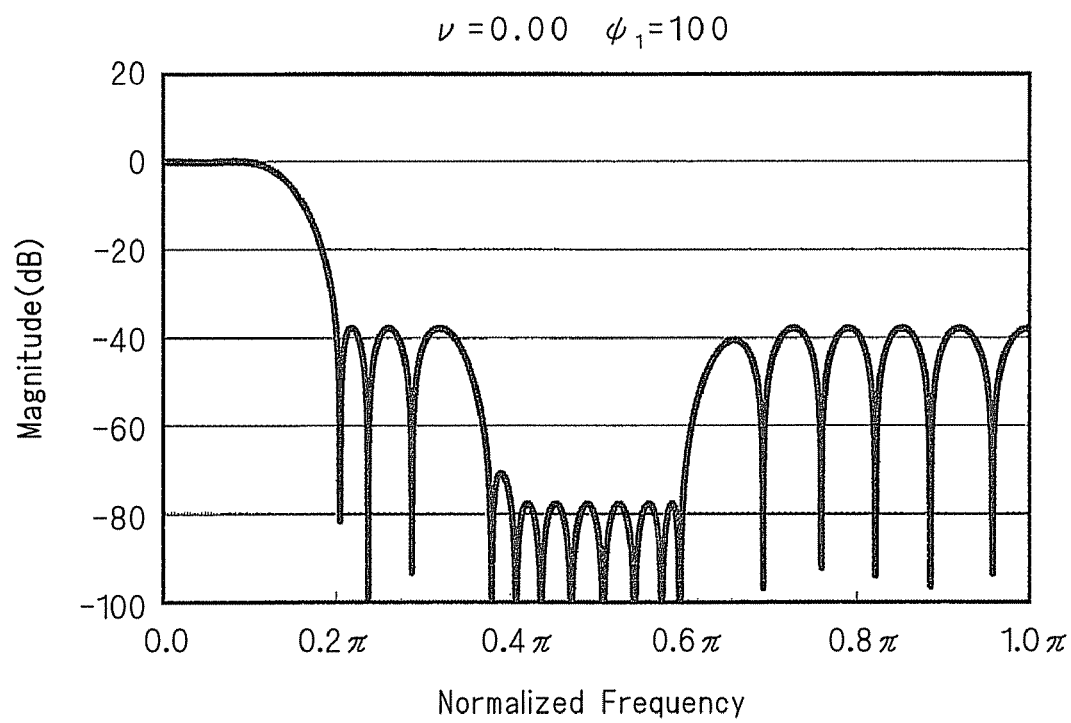
FIG. 10 is a view for showing another example of amplitude characteristics of a filtering process carried out in the signal processor according to the preferred embodiment of the present invention.
Figure 11:
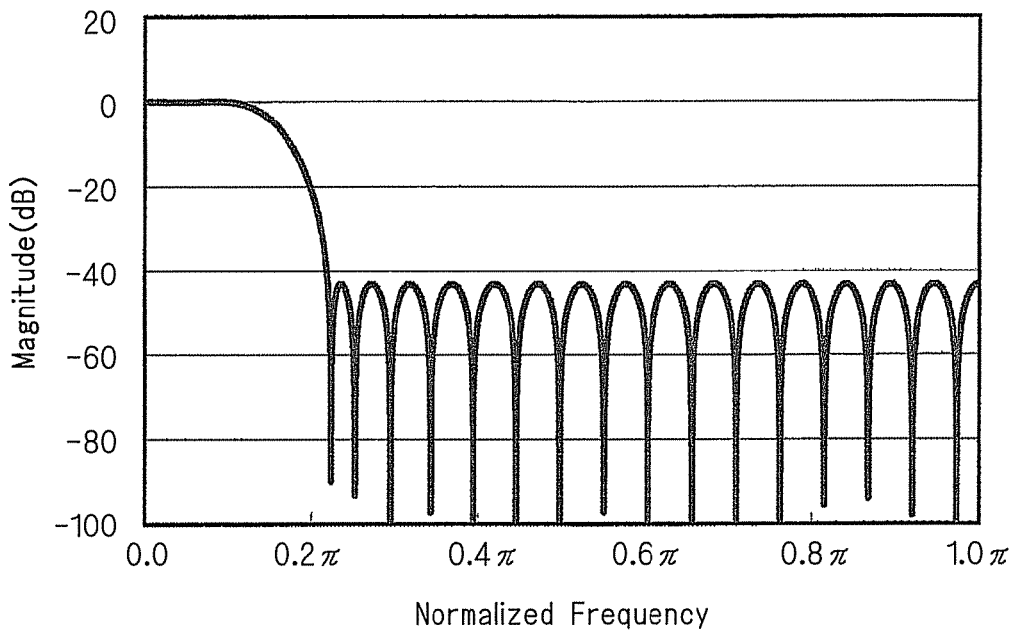
FIG. 11 is a view for showing another example of amplitude characteristics of a filtering process carried out in the signal processor according to the preferred embodiment of the present invention.
Figure 12:
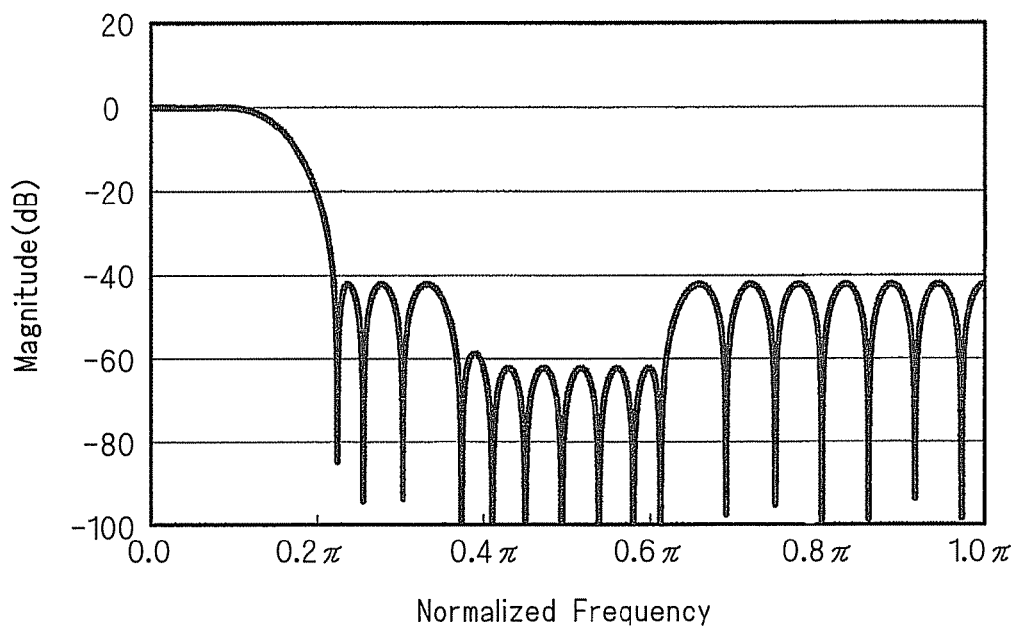
FIG. 12 is a view for showing another example of amplitude characteristics of a filtering process carried out in the signal processor according to the preferred embodiment of the present invention.
Figure 13:
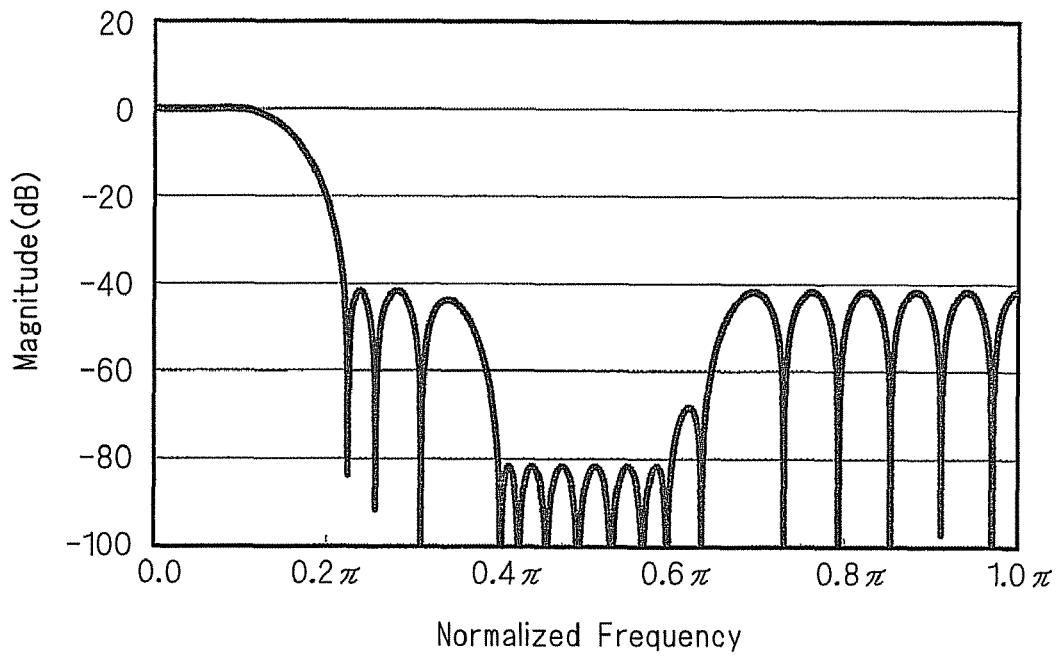
FIG. 13 is a view for showing another example of amplitude characteristics of a filtering process carried out in the signal processor according to the preferred embodiment of the present invention.

Next, an example of a design of a digital filter in the weighing device according to the present preferred embodiment will be described. FIGS. 5 through 13 show amplitude characteristics which are provided when designing a digital filter according to specifications No. 1 shown by the following table. A horizontal axis and a vertical axis in the figures represent a normalized angular frequency and amplitude, respectively. It is noted that in the following specifications No. 1, k=1, the parameter $\delta_1$ is fixedly set to "0", and only a starting frequency of a stopband and an amount of attenuation in an attenuation band are variable.

TABLE 1

| [Specifications No. 1] | |
| --- | --- |
| Order of filter: | 2N = 38 |
| Order of polynomial: | $L_S$ = 6, $L_{W1}$ = 3 |
| Passband: | $\omega_P$ = 0.1 π |
| Stopband: | $\omega_S$ = 0.2 π |
|  | ν = −0.02 π-0.02 π |
| Attenuation band: | k = 1 |
|  | $\phi_1$ = 0.5 π |
|  | $\tau_1$ = 0.2 π |
|  | $\phi_1$ = 1-100 |

It is appreciated from graphs in FIGS. 5 through 13 that variation in a value of the parameter ν causes variation in the starting frequency of the stopband. It is also appreciated that variation in a value of the parameter $\phi_1$ causes variation in an amount of attenuation in the attenuation band where attenuation is locally great in the stopband. It is further appreciated that regions other than the attenuation band in the stopband have characteristics similar to equal ripple property.

Figure 14:
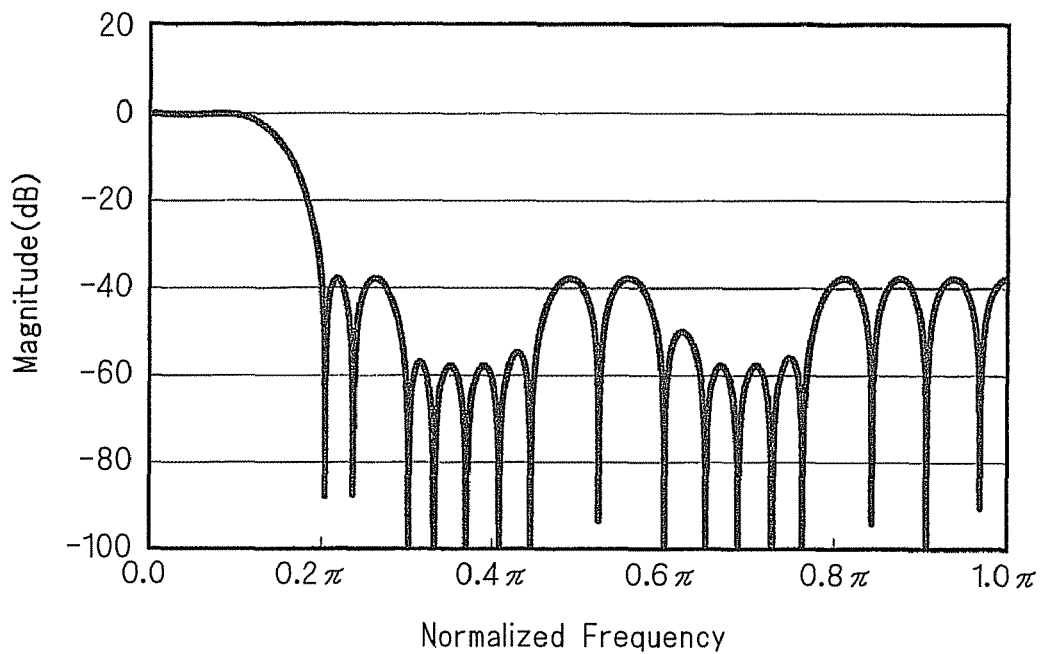
FIG. 14 is a view for showing another example of amplitude characteristics of a filtering process carried out in the signal processor according to the preferred embodiment of the present invention.
Figure 17:
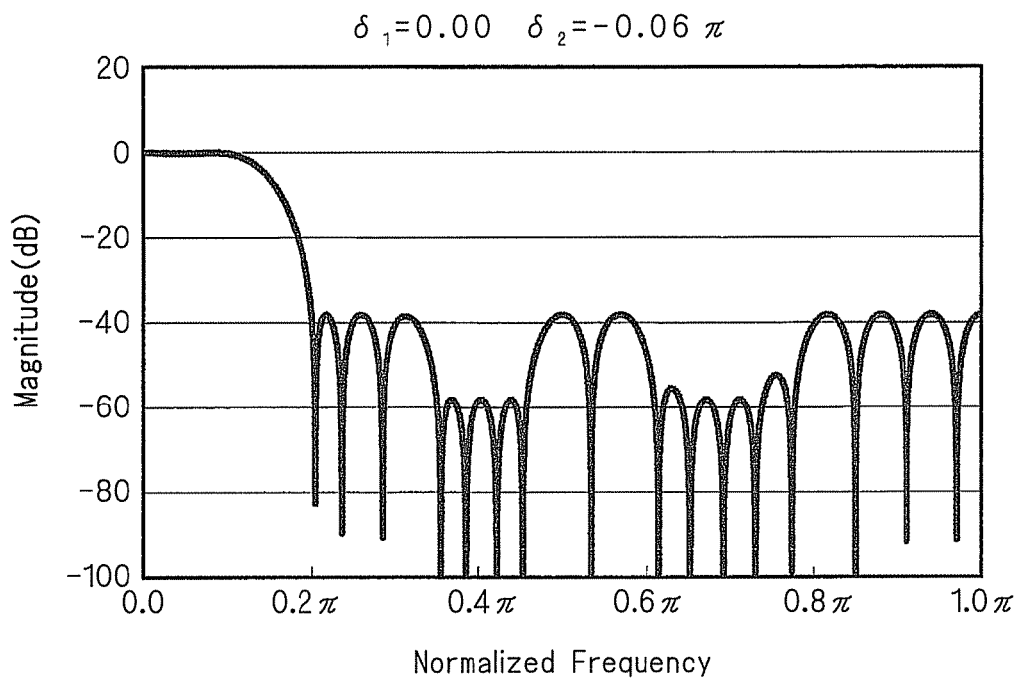
FIG. 17 is a view for showing another example of amplitude characteristics of a filtering process carried out in the signal processor according to the preferred embodiment of the present invention.
Figure 18:
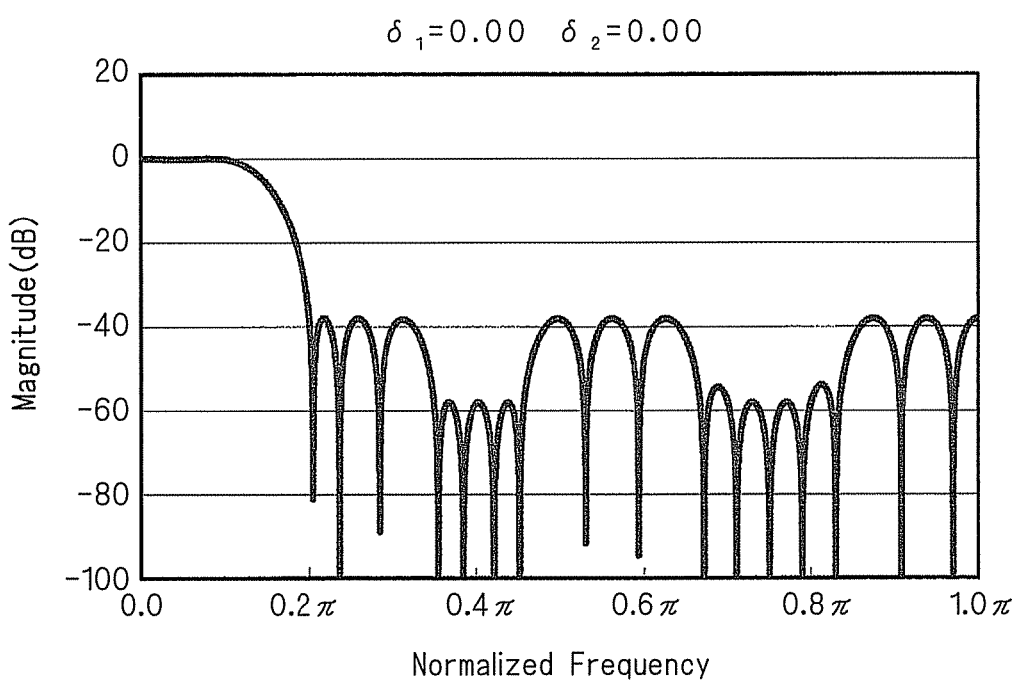
FIG. 18 is a view for showing another example of amplitude characteristics of a filtering process carried out in the signal processor according to the preferred embodiment of the present invention.

FIGS. 14 through 22 show amplitude characteristics which are provided when designing a digital filter according to specifications No. 2 shown by the following table 2. A horizontal axis and a vertical axis in the figures represent a normalized angular frequency and amplitude, respectively. It is noted that in the following specifications No. 2, k=2, the parameter ν is fixedly set to "0", each of the parameters $\phi_1$ and $\phi_2$ is fixedly set to "10", and only band positions of attenuation bands are variable.

TABLE 2

| [Specifications No. 2] | |
| --- | --- |
| Order of filter: | 2N = 38 |
| Order of polynomial: | $L_{C1}$ = $L_{C2}$ = 3 |
| Passband: | $\omega_P$ = 0.1 π |
| Stopband: | $\omega_S$ = 0.2 π |
| Attenuation band: | k = 2 |
|  | $\phi_1$ = 0.4 π, $\phi_2$ = 0.75 π |
|  | $\tau_1$ = $\tau_2$ = 0.1 π |
|  | $\phi_1$ = −0.03 π-0.03 π, $\phi_2$ = −0.06 π-0.06 π |

It is appreciated from graphs in FIGS. 14 through 22 that variation in values of the parameters $\phi_1$ and $\phi_2$ causes variation in the band positions of their corresponding attenuation bands.

Figure 29:
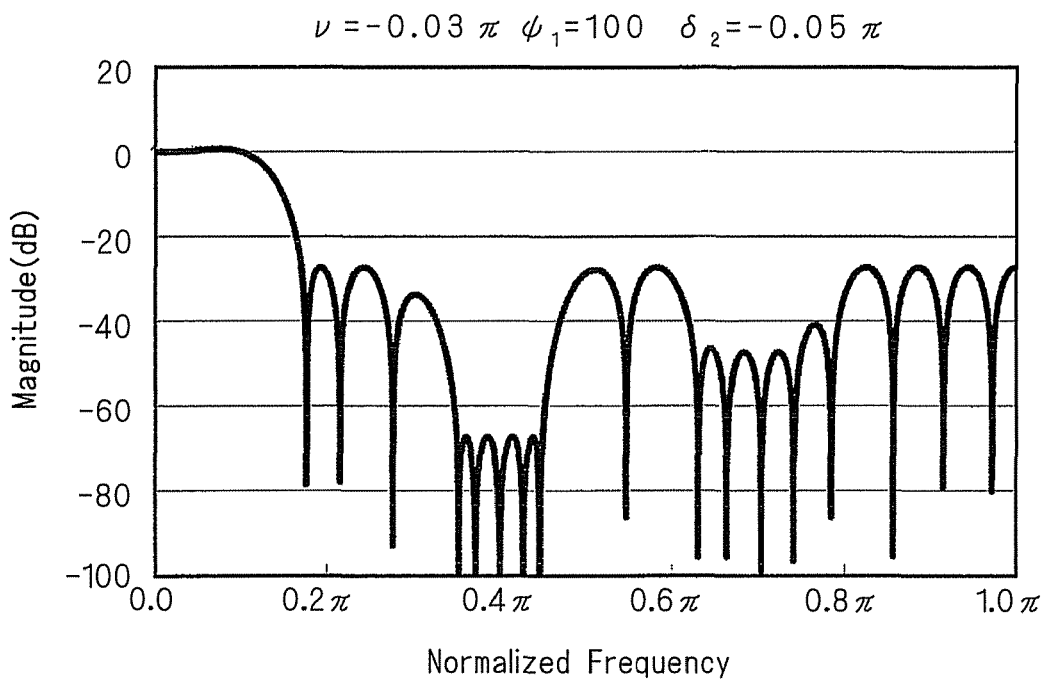
FIG. 29 is a view for showing another example of amplitude characteristics of a filtering process carried out in the signal processor according to the preferred embodiment of the present invention.
Figure 30:
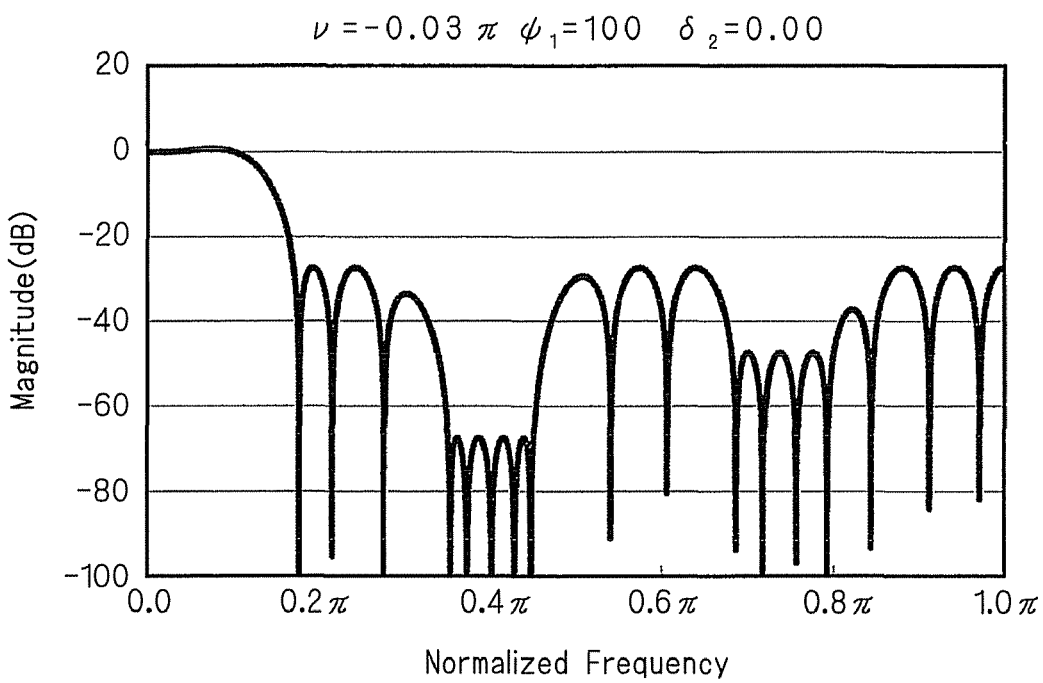
FIG. 30 is a view for showing another example of amplitude characteristics of a filtering process carried out in the signal processor according to the preferred embodiment of the present invention.
Figure 37:
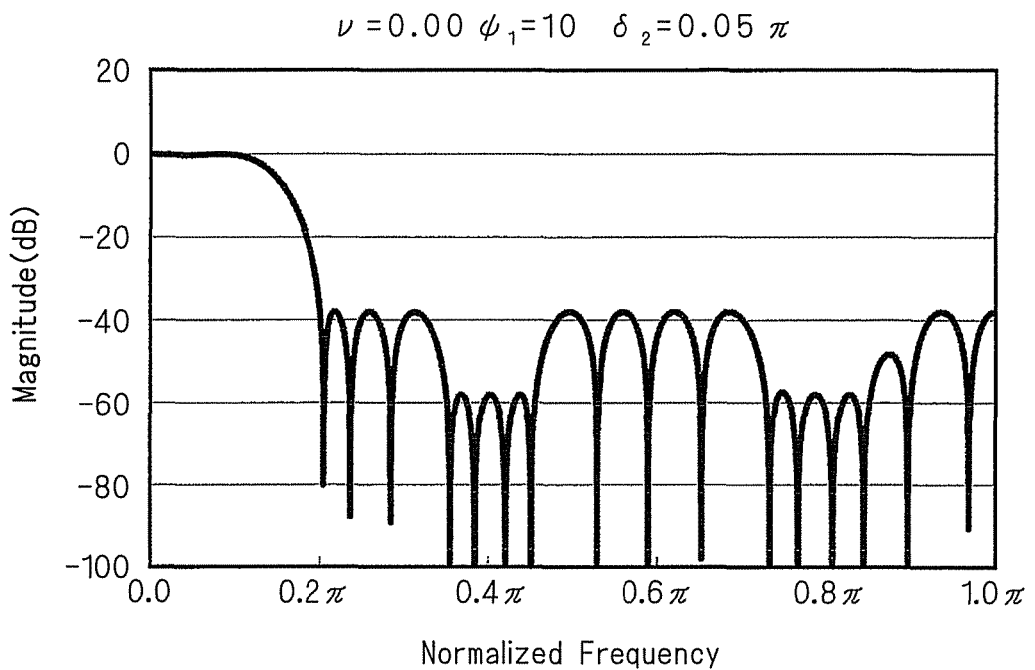
FIG. 37 is a view for showing another example of amplitude characteristics of a filtering process carried out in the signal processor according to the preferred embodiment of the present invention.
Figure 38:
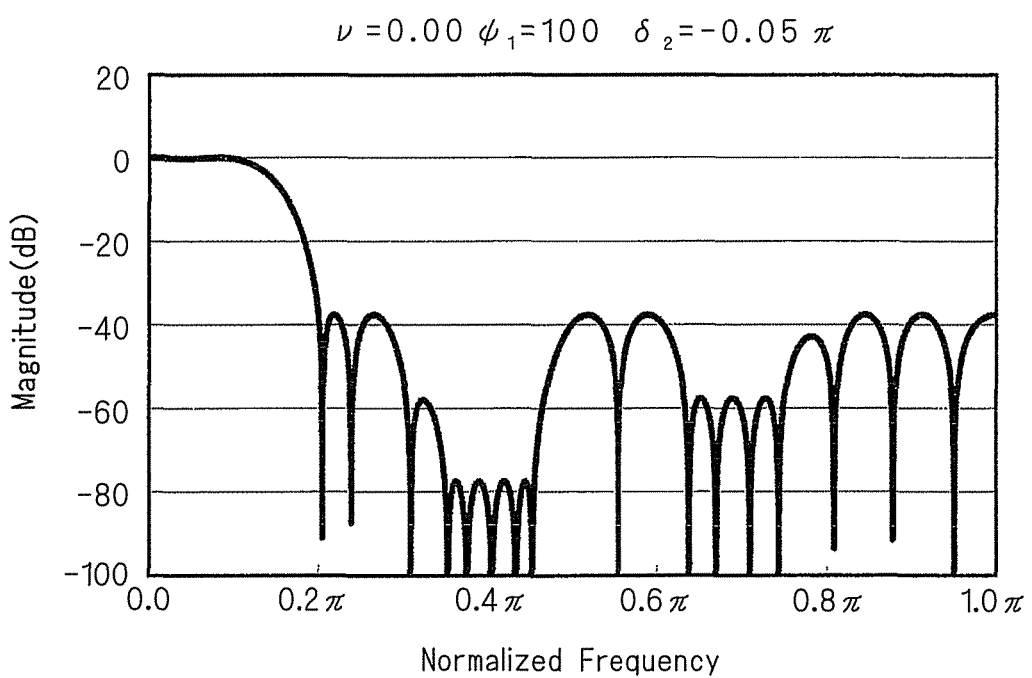
FIG. 38 is a view for showing another example of amplitude characteristics of a filtering process carried out in the signal processor according to the preferred embodiment of the present invention.
Figure 49:
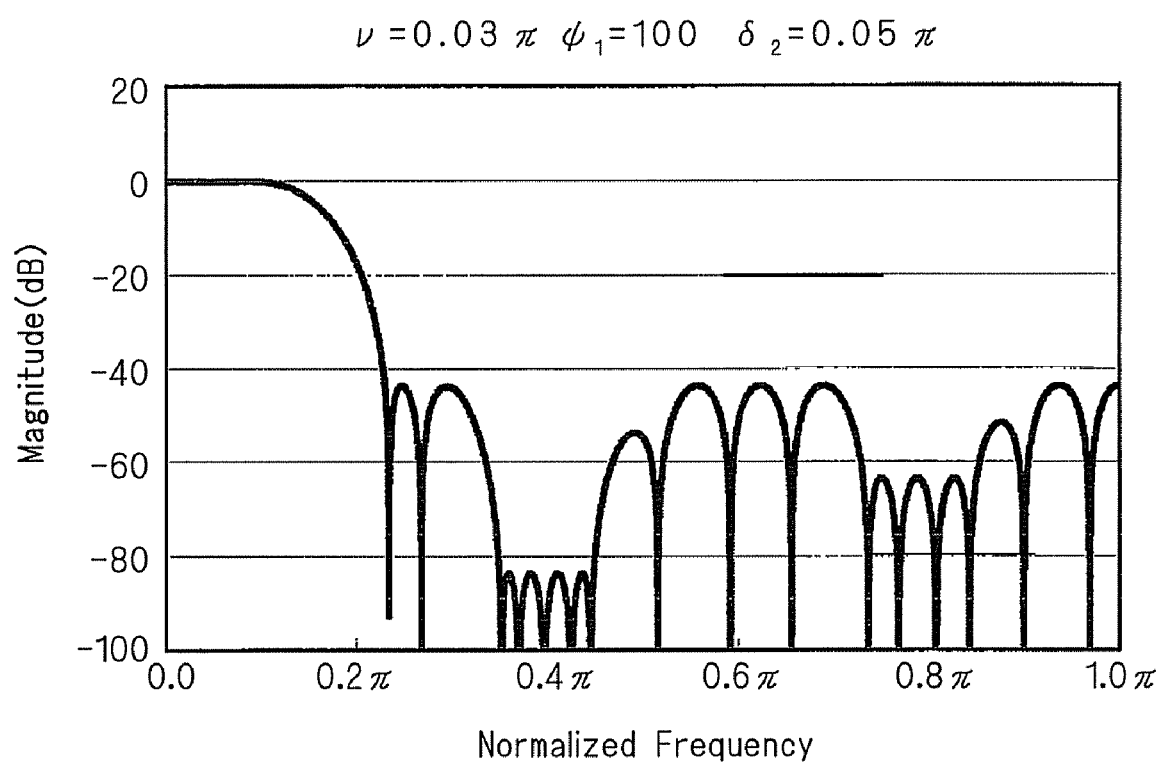
FIG. 49 is a view for showing another example of amplitude characteristics of a filtering process carried out in the signal processor according to the preferred embodiment of the present invention.

FIGS. 23 through 49 show amplitude characteristics which are provided when designing a digital filter with specifications No. 3 shown by the following table 3. A horizontal axis and a vertical axis in the figures represent a normalized angular frequency and amplitude, respectively. It is noted that in the following specifications No. 3, k=2, the parameter $\delta_1$ is fixedly set to "0", the parameters $\phi_2$ is fixedly set to "10", and a starting frequency of a stopband, amounts of attenuation in attenuation bands corresponding to the parameters $\phi_1$ and $\delta_2$, and the band positions of attenuation bands corresponding to the parameters $\phi_1$ and $\delta_2$ are variable.

TABLE 3

[Specifications No. 3]

| | |
|---|---|
| Order of filter: | 2N = 38 |
| Order of polynomial: | $L_S = L_{C1} = L_{C2} = L_{W1} = L_{W2} = 3$ |
| Passband: | $\omega_P = 0.1\,\pi$ |
| Stopband: | $\omega_S = 0.2\,\pi$ |
| | $\nu = -0.03\,\pi\text{-}0.03\,\pi$ |
| Attenuation band: | k = 2 |
| | $\phi_1 = 0.4\,\pi, \phi_2 = 0.75\,\pi$ |
| | $\tau_1 = \tau_2 = 0.1\,\pi$ |
| | $\delta_1 = 0$ (Fixed), $\delta_2 = -0.05\,\pi\text{-}0.05\,\pi$ |
| | $\varphi_1 = 1\text{-}100, \varphi_2 = 10$ (Fixed) |

As described above, according to the present preferred embodiment, the filter coefficient $h_i$ can be changed by using the parameters $\phi_1$-$\phi_k$ which specify amounts of attenuation in attenuation bands, so that amounts of attenuation in corresponding attenuation bands can be easily changed. Accordingly, even if the level of a noise changes, it is possible to surely cancel the noise. As a result, highly accurate weighing is possible.

Also, the filter coefficient $h_i$ can be changed by using the parameters $\delta_1$-$\delta_k$ which specify band positions of attenuation bands, so that the band positions of the attenuation bands can be easily changed. Accordingly, even if the frequency of a noise changes, it is possible to surely cancel the noise.

Also, the filter coefficient $h_i$ can be changed by using the parameter $\nu$ which specifies a starting frequency of a stopband, so that the starting frequency of the stopband can be easily changed. Accordingly, even if a noise occurs in a transition band between a passband and a stopband (a band between $\omega_P$ and $\omega_S$ in the amplitude characteristics shown in FIG. 4), it is possible to surely cancel the noise.

Further, respective amounts of attenuation and band positions of plural attenuation bands can be specified by the parameters $\delta_1$-$\delta_k$ and $\phi_1$-$\phi_k$. Thus, even if there are plural factors of occurrence of noise and the factors vary, it is possible to surely cancel the noise.

Moreover, according to the present preferred embodiment, an amount of deviation from a center frequency of a range within which a starting frequency of a stopband can vary is given as the parameter $\nu$, and an amount of deviation from a center frequency of a range within which the band position of a corresponding attenuation band is given as each of the parameters $\delta_1$-$\delta_k$. As such, it is possible to approximate parameters $\nu$ and $\delta_1$-$\delta_k$ in the same manner in calculating the filter coefficient $h_i$ using the expression (2). For example, assuming that k=2, $\nu=0.02\pi$, $\delta_1=0.02\pi$, $\delta_2=0.02\pi$, $L_S=4$, $L_{C1}=4$, and $L_{C2}=4$, a relationship "$\nu^4 = \delta_1^4 = \delta_2^4 = 0.00000016\pi^4$" is established, in other words, $\nu^4$, $\delta_1^4$ and $\delta_2^4$ are the same value. Thus, it is possible to approximate the parameters $\nu$ and $\delta_1$-$\delta_k$ in the same manner in calculating the filter coefficient $h_i$.

In contrast thereto, unlike the present preferred embodiment, in a case where a starting frequency itself of a stopband is input to the parameter $\nu$, and a center frequency of a corresponding attenuation band is input to each of the parameters $\delta_1$-$\delta_k$, it is impossible to approximate the parameters $\nu$ and $\delta_1$-$\delta_k$ in the same manner in calculating the filter coefficient $h_i$. For example, assuming that k=2, $\nu=\omega_S=0.2\pi$, $\delta_1=\phi_1=0.4\pi$, $\delta_2=\phi_2=0.75\pi$, $L_S=4$, $L_{C1}=4$, and $L_{C2}=4$, it results in that $\nu^4=0.0016\pi^4$, $\delta_1^4=0.0256\pi^4$, and $\delta_2^4=0.31640625\pi^4$, in other words, $\nu^4$, $\delta_1^4$, and $\delta_2^4$ are greatly different from one another. Thus, if approximations are made on the parameters $\nu$ and $\delta_1$-$\delta_k$ in the same manner, a rounding error or the like occurs in the parameters $\nu$ and $\delta_1$. As such, desired characteristics cannot be obtained in a band near frequencies which are input to the parameters $\nu$ and $\delta_1$ in some cases.

As is made clear from the above description, according to the present preferred embodiment, it is possible to approximate the parameters $\nu$ and $\delta_1$-$\delta_k$ in the same manner in calculating the filter coefficient $h_i$, to thereby achieve desired filter design.

In the meantime, the above description can be treated as the invention regarding a method of designing a typical digital filter. Thus, a digital filter in which a starting frequency of a stopband, the band position of an attenuation band, and an amount of attenuation in an attenuation band are variable can be designed by the following method.

First, a value of the coefficient g is determined based on the reference amplitude characteristics in the above-described manner, and the filter coefficient $h_i$ of a digital filter is approximated by the above expression (2) using the value of the coefficient g. Then, a value is substituted into each of the parameters in the expression (2), to calculate the sequence $\{h_i\}$ of the filter coefficient $h_i$ of the digital filter.

If change in the filter characteristics is required, one or some out of the values of the parameters $\nu$, $\delta_1$-$\delta_k$, and $\phi_1$-$\phi_k$, which should be changed, are changed, to change the filter coefficient $h_i$. As a result, the filter characteristics are changed to desired characteristics.

To employ the above-described method of designing a digital filter would allow easier change in filter characteristics. Accordingly, a noise can be surely cancelled.

The above description has dealt with a design of a low pass filter. However, the present invention is also applicable to designs of the other filters than a low pass filter (band-pass filters, high pass filters and the like). Further, although the above description has dealt with a design of an FIR filter, the present invention is also applicable to a design of an IIR filter.

While the invention has been shown and described in detail, the foregoing description is in all aspects illustrative and not restrictive. It is therefore understood that numerous modifications and variations can be devised without departing from the scope of the invention.

The invention claimed is:

1. A noise canceling device comprising:
a signal processor for carrying out a filtering process on a digital signal using a variable filter coefficient; and
a filter coefficient calculator for calculating said filter coefficient using a predetermined mathematical expression and outputting said filter coefficient to said signal processor, wherein
said mathematical expression includes a first parameter which specifies an amount of attenuation in at least one attenuation band where attenuation should be locally intensified in a stopband of amplitude characteristics of said filtering process, and
said filter coefficient calculator changes said filter coefficient by substituting an input value of said first parameter into said mathematical expression, so that said amount of attenuation in said at least one attenuation band is changeable to a desired amount of attenuation which is specified by said first parameter.

2. The noise canceling device according to claim 1, wherein
said mathematical expression further includes a second parameter which specifies a band position of said at least one attenuation band, and
said filter coefficient calculator changes said filter coefficient by substituting an input value of said second parameter into said mathematical expression, so that said band position of said at least one attenuation band is changeable to a desired band position which is specified by said second parameter.

3. The noise canceling device according to claim 2, wherein
said first parameter is a parameter which specifies respective amounts of attenuation in plural attenuation bands where attenuation should be locally intensified in said stopband,
said second parameter is a parameter which specifies respective band positions of said plural attenuation bands,
said filter coefficient calculator changes said filter coefficient by substituting an input value of said first parameter into said mathematical expression, so that said respective amounts of attenuation in said plural attenuation bands are individually changeable to desired amounts of attenuation which are specified by said first parameter, and
said filter coefficient calculator changes said filter coefficient by substituting an input value of said second parameter into said mathematical expression, so that said respective band positions of said plural attenuation bands are individually changeable to desired band positions which are specified by said second parameter.

4. The noise canceling device according to claim 3, wherein
said mathematical expression further includes a third parameter which specifies a starting frequency of said stopband,
said filter coefficient calculator changes said filter coefficient by substituting an input value of said third parameter into said mathematical expression, so that said starting frequency of said stopband is changeable to a desired frequency which is specified by said third parameter.

5. The noise canceling device according to claim 4, wherein
an amount of deviation from a center frequency of a range within which each of said respective band positions of said plural attenuation bands varies is given as said second parameter, and
an amount of deviation from a center frequency of a range within which said starting frequency of said stopband varies is given as said third parameter.

6. The noise canceling device according to claim 3, wherein
an amount of deviation from a center frequency of a range within which each of said respective band positions of said plural attenuation bands varies is given as said second parameter.

7. The noise canceling device according to claim 1, wherein
said mathematical expression further includes a second parameter which specifies a starting frequency of said stopband,
said filter coefficient calculator changes said filter coefficient by substituting an input value of said second parameter into said mathematical expression, so that said starting frequency of said stopband is changeable to a desired frequency which is specified by said second parameter.

8. A noise canceling device comprising:
a signal processor for carrying out a filtering process on a digital signal using a variable filter coefficient; and
a filter coefficient calculator for calculating said filter coefficient using a predetermined mathematical expression and outputting said filter coefficient to said signal processor, wherein
said mathematical expression includes a first parameter which specifies a starting frequency of a stopband of amplitude characteristics of said filtering process, and
said filter coefficient calculator changes said filter coefficient by substituting an input value of said first parameter into said mathematical expression, so that said starting frequency of said stopband is changeable to a desired frequency which is specified by said first parameter.

9. The noise canceling device according to claim 8, wherein
said mathematical expression includes a second parameter which specifies a band position of at least one attenuation band where attenuation should be locally intensified in said stopband, and
said filter coefficient calculator changes said filter coefficient by substituting an input value of said second parameter into said mathematical expression, so that said band position of said at least one attenuation band is changeable to a desired band position which is specified by said second parameter.

10. The noise canceling device according to claim 9, wherein
said second parameter is a parameter which specifies respective band positions of attenuation in plural attenuation bands where attenuation should be locally intensified in said stopband, and
said filter coefficient calculator changes said filter coefficient by substituting an input value of said second parameter into said mathematical expression, so that said respective band positions of said plural attenuation bands are individually changeable to desired band positions which are specified by said second parameter.

11. The noise canceling device according to claim 10, wherein
an amount of deviation from a center frequency of a range within which each of said respective band positions of said plural attenuation bands varies is given as said second parameter.

12. The noise canceling device according to claim 11, wherein
an amount of deviation from a center frequency of a range within which said starting frequency of said stopband varies is given as said first parameter.

13. A weighing device comprising:
a noise canceling device; and
a measuring part for detecting a weight of an object under measurement,
said noise canceling device including
a signal processor for carrying out a filtering process on a digital signal using a variable filter coefficient, and
a filter coefficient calculator for calculating said filter coefficient using a predetermined mathematical expression and outputting said filter coefficient to said signal processor, wherein
said mathematical expression includes a parameter which specifies an amount of attenuation in at least one attenuation band where attenuation should be locally intensified in a stopband of amplitude characteristics of said filtering process,
said filter coefficient calculator changes said filter coefficient by substituting an input value of said parameter into said mathematical expression, so that said amount of attenuation in said at least one attenuation band is changeable to a desired amount of attenuation which is specified by said parameter, and said noise canceling device carries out said filtering process on a digital signal which is obtained as a result of measurement in said measuring part.

14. A method of canceling a noise, comprising the steps of:
(a) calculating a filter coefficient using a predetermined mathematical expression; and
(b) carrying out, by a processor, a filtering process on a digital signal using said filter coefficient which is calculated in said step (a), wherein
said mathematical expression includes a parameter which specifies an amount of attenuation in at least one attenuation band where attenuation should be locally intensified in a stopband of amplitude characteristics of said filtering process,
said step (a) includes a step of (a-1) changing said filter coefficient by substituting a value of said parameter into said mathematical expression, and
said amount of attenuation in said at least one attenuation band is changed to a desired amount of attenuation which is specified by said parameter by performing said step (a-1).

15. A method of canceling a noise, comprising the steps of:
(a) calculating a filter coefficient using a predetermined mathematical expression; and
(b) carrying out, by a processor, a filtering process on a digital signal using said filter coefficient which is calculated in said step (a), wherein
said mathematical expression includes a parameter which specifies a starting frequency of a stopband of amplitude characteristics of said filtering process,
said step (a) includes a step of (a-1) changing said filter coefficient by substituting a value of said parameter into said mathematical expression, and
said starting frequency of said stopband is changed to a desired frequency which is specified by said parameter by performing said step (a-1).

16. A method of designing a digital filter in which an amount of attenuation in at least one attenuation band where attenuation should be locally intensified in a stopband of amplitude characteristics is variable, said method comprising the steps of:
(a) approximating, by a computer, a filter coefficient of said digital filter by a predetermined mathematical expression including a parameter which specifies said amount of attenuation in said at least one attenuation band, based on reference amplitude characteristics of said digital filter; and
(b) calculating said filter coefficient using said mathematical expression, wherein
said step (b) includes a step of (b-1) changing said filter coefficient by substituting a value of said parameter into said mathematical expression, and
said amount of attenuation in said at least one attenuation band is changed to a desired amount of attenuation which is specified by said parameter by performing said step (b-1).

17. A method of designing a digital filter in which a starting frequency of a stopband is variable, said method comprising the steps of:
(a) approximating, by a computer, a filter coefficient of said digital filter by a predetermined mathematical expression including a parameter which specifies said starting frequency of said stopband, based on reference amplitude characteristics of said digital filter; and
(b) calculating said filter coefficient using said mathematical expression, wherein
said step (b) includes a step of (b-1) changing said filter coefficient by substituting a value of said parameter into said mathematical expression, and
said starting frequency of said stopband is changed to a desired frequency which is specified by said parameter by performing said step (b-1).

18. A weighing device comprising:
a noise canceling device; and
a measuring part for detecting a weight of an object under measurement,
said noise canceling device including
a signal processor for carrying out a filtering process on a digital signal using a variable filter coefficient, and
a filter coefficient calculator for calculating said filter coefficient using a predetermined mathematical expression and outputting said filter coefficient to said signal processor, wherein
said mathematical expression includes a parameter which specifies a starting frequency of a stopband of amplitude characteristics of said filtering process,
said filter coefficient calculator changes said filter coefficient by substituting an input value of said parameter into said mathematical expression, so that said starting frequency of said stopband is changeable to a desired frequency which is specified by said parameter, and
said noise canceling device carries out said filtering process on a digital signal which is obtained as a result of measurement in said measuring part.

* * * * *

UNITED STATES PATENT AND TRADEMARK OFFICE
CERTIFICATE OF CORRECTION

PATENT NO. : 8,392,493 B2
APPLICATION NO. : 12/301380
DATED : March 5, 2013
INVENTOR(S) : Naoyuki Aikawa et al.

It is certified that error appears in the above-identified patent and that said Letters Patent is hereby corrected as shown below:

In the specification, Column 13, line 12, delete "$\delta_k \in [\phi_{kmin}, \phi_{kmax}]$," and insert -- $\delta_k \in [\delta_{kmin}, \delta_{kmax}]$ -- therefor.

In the specification, Column 14, lines 6-10, delete $$G(i, l_S, l_{C1}, l_{C2}, \ldots, l_{Ck}, l_{W1}, l_{W2}, \ldots, l_{Wk}) =$$
$$[g(0, 0, 0, 0, \ldots 0, 0, 0, \ldots 0)g(0, 0, 0, 0, \ldots 0, 0, 0, \ldots,$$
$$[g(0, 0, 0, \ldots 0, 0, 0, \ldots, 0)g(0, 0, 0, 0, \ldots 0, 0, 0, \ldots, 1) \ldots$$
$$g(i, l_S, l_{C1}, l_{C2}, \ldots, l_{Ck}, l_{W1}, l_{W2}, \ldots, l_{Wk}) \ldots$$
$$\ldots g(N, L_S, L_{C1}, L_{C2}, \ldots, L_{Ck}, L_{W1}, L_{W2}, \ldots, L_{Wk})]$$ " and insert --
$$G(i, l_S, l_{C1}, l_{C2}, \cdots, l_{Ck}, l_{W1}, l_{W2}, \cdots, l_{Wk})$$
$$= [g(0,0,0,0,\cdots 0,0,0,\cdots,0) g(0,0,0,0,\cdots 0,0,0,\cdots,1) \cdots$$
$$\cdots g(i, l_S, l_{C1}, l_{C2}, \cdots, l_{Ck}, l_{W1}, l_{W2}, \cdots, l_{Wk}) \cdots g(N, L_S, L_{C1}, L_{C2}, \cdots, L_{Ck}, L_{W1}, L_{W2}, \cdots, L_{Wk})]^T$$
-- therefor.

In the specification, Column 14, line 40, After "tolerance" insert -- $\lambda$ --.

In the specification, Column 14, lines 60-64, delete $$U(x) =$$
$$\mathrm{diag}[\Gamma(\omega_1, v_1, \delta_{1,1}, \delta_{2,1}, \ldots, \delta_{k,1}, \phi_{1,1}, \phi_{2,1}, \ldots, \phi_{k,1}) \ldots \Gamma(\omega_m,$$
$$v_q, \delta_{1,t1}, \delta_{2,t2}, \delta_{2,t2}, \ldots, \delta_{k,tk}, \phi_{1,r1}, \phi_{2,r2}, \ldots, \phi_{k,rk}) \ldots$$
$$\ldots (\omega_M, v_Q, \delta_{1,T1}, \delta_{2,T2}, \ldots, \delta_{k,Tk}, \phi_{1,R1}, \phi_{2,R2}, \ldots, \phi_{k,Rk})]$$ " and Signed and Sealed this
Eleventh Day of June, 2013

Teresa Stanek Rea
*Acting Director of the United States Patent and Trademark Office*

CERTIFICATE OF CORRECTION (continued)
U.S. Pat. No. 8,392,493 B2 insert $$U(x) = \text{diag}[\Gamma(\omega_1, \nu_1, \delta_{1,1}, \delta_{2,1}, \cdots, \delta_{k,1}, \psi_{1,1}, \psi_{2,1}, \cdots, \psi_{k,1}) \cdots$$
$$\cdots \Gamma(\omega_q, \nu_q, \delta_{1,t1}, \delta_{2,t2}, \cdots, \delta_{k,tk}, \psi_{1,r1}, \psi_{2,r2}, \cdots, \psi_{k,rk}) \cdots$$
$$\cdots \Gamma(\omega_M, \nu_Q, \delta_{1,T1}, \delta_{2,T2}, \cdots, \delta_{k,Tk}, \psi_{1,R1}, \psi_{2,R2}, \cdots, \psi_{k,Rk})]$$

therefor.

In the specification, Column 15, lines 18-21, delete $$x = [\lambda(\omega_1, \nu_1, \delta_{1,1}, \delta_{2,1}, \ldots, \delta_{k,1}, \phi_{1,1}, \phi_{2,1}, \ldots, \phi_{k,1}) \cdots$$
$$\lambda(\omega_m, \nu_q, \delta_{1,t1}, \delta_{2,t2}, \ldots, \delta_{k,tk}, \phi_{1,r1}, \phi_{2,r2}, \ldots, \phi_{k,rk}) \cdots$$
$$\lambda(\omega_M, \nu_Q, \delta_{1,T1}, \delta_{2,T2}, \ldots, \delta_{k,Tk}, \phi_{1,R1}, \phi_{2,T2}, \ldots, \phi_{k,Rk})$$
$$G(i, l_S, l_{C1}, l_{C2}, \ldots, l_{Ck}, l_{W1}, l_{W2}, \ldots, l_{Wk})^T]$$

" and insert $$x = [\lambda(\omega_1, \nu_1, \delta_{1,1}, \delta_{2,1}, \cdots, \delta_{k,1}, \psi_{1,1}, \psi_{2,1}, \cdots, \psi_{k,1}) \cdots$$
$$\cdots \lambda(\omega_m, \nu_q, \delta_{1,t1}, \delta_{2,t2}, \cdots, \delta_{k,tk}, \psi_{1,r1}, \psi_{2,r2}, \cdots, \psi_{k,rk}) \cdots$$
$$\cdots \lambda(\omega_M, \nu_Q, \delta_{1,T1}, \delta_{2,T2}, \cdots, \delta_{k,Tk}, \psi_{1,R1}, \psi_{2,R2}, \cdots, \psi_{k,Rk}) G(i, l_S, l_{C1}, l_{C2}, \cdots, l_{Ck}, l_{W1}, l_{W2}, \cdots, l_{Wk})^T]^T$$

therefor.